(12) United States Patent
Birkner et al.

(10) Patent No.: US 12,444,634 B2
(45) Date of Patent: Oct. 14, 2025

(54) DEVICE AND METHOD FOR IMAGING AN OBJECT IN AT LEAST TWO VIEWS

(71) Applicant: Integrated Dynamics Engineering GMBH, Raunheim (DE)

(72) Inventors: Andreas Birkner, Jena (DE); Ralf Langenbach, Freudenberg (DE)

(73) Assignee: INTEGRATED DYNAMICS ENGINEERING GMBH, Raunheim (DE)

( * ) Notice: Subject to any disclaimer, the term of this patent is extended or adjusted under 35 U.S.C. 154(b) by 280 days.

(21) Appl. No.: 18/032,665

(22) PCT Filed: Oct. 19, 2021

(86) PCT No.: PCT/EP2021/078862
§ 371 (c)(1),
(2) Date: Apr. 19, 2023

(87) PCT Pub. No.: WO2022/084271
PCT Pub. Date: Apr. 28, 2022

(65) Prior Publication Data
US 2023/0395417 A1 Dec. 7, 2023

(30) Foreign Application Priority Data
Oct. 20, 2020 (DE) ............... 10 2020 127 580.3

(51) Int. Cl.
*H01L 21/68* (2006.01)
*H01L 21/67* (2006.01)
*H01L 21/687* (2006.01)

(52) U.S. Cl.
CPC ...... *H01L 21/681* (2013.01); *H01L 21/67259* (2013.01); *H01L 21/68707* (2013.01)

(58) Field of Classification Search
CPC ............. H01L 21/681; H01L 21/67259; H01L 21/68707
See application file for complete search history.

(56) References Cited

U.S. PATENT DOCUMENTS

| 5,666,197 A * | 9/1997 | Guerra ................ G01B 11/303 |
| 2002/0085199 A1 | 7/2002 | Shires |

(Continued)

FOREIGN PATENT DOCUMENTS

| DE | 102008018586 A1 | 11/2009 |
| DE | 102010053912 A1 | 6/2012 |

(Continued)

OTHER PUBLICATIONS

German Office Action corresponding to German Application 102020127580.3, dated Jun. 16, 2021, 5 pages.

(Continued)

*Primary Examiner* — Georgia Y Epps
*Assistant Examiner* — Don J Williams
(74) *Attorney, Agent, or Firm* — Reising Ethington P.C.

(57) ABSTRACT

The present disclosure relates to a device and to a method for imaging an object in at least two views. The device and the method can be used, for example, for teaching-in or monitoring a robot or for monitoring handling systems or, more generally, with devices which require imaging of an object for an analysis or a monitoring process. The device allows an object to be imaged in at least two different views simultaneously, comprising at least one imaging optical element and at least one reflective element, wherein the reflective element is at least partly arranged within an object space of the imaging optical element, an optical axis of the imaging optical element being associated with a first view of (Continued)

the object, and wherein the reflective element is operable to image a second view of the object, which is different from the first view.

27 Claims, 15 Drawing Sheets

(56) References Cited

U.S. PATENT DOCUMENTS

| | | |
|---|---|---|
| 2014/0340509 A1 | 11/2014 | Fairbairn |
| 2016/0370716 A1* | 12/2016 | Lof .................... H01L 22/12 |
| 2017/0248794 A1* | 8/2017 | Eurlings ............ G03F 7/70616 |

FOREIGN PATENT DOCUMENTS

| | | | |
|---|---|---|---|
| DE | 102012008586 A1 | 10/2013 | |
| DE | 102015013500 A1 | 4/2017 | |
| DE | 102020112146 A1 | 11/2021 | |
| DE | 102020112149 A1 | 11/2021 | |
| EP | 3648150 A1 | 5/2020 | |
| EP | 3648152 A1 | 5/2020 | |
| KR | 20090045504 A | 5/2009 | |
| KR | 20120101866 A | 9/2012 | |
| NL | 3333632 A1 * | 8/2001 | ............ G03F 7/20 |

OTHER PUBLICATIONS

International Search Report for Application No. PCT/EP2021/078862, dated Jan. 27, 2022, 7 pages.
Written Opinion for Application No. PCT/EP2021/078862, dated Jan. 27, 2022, 6 pages.

* cited by examiner

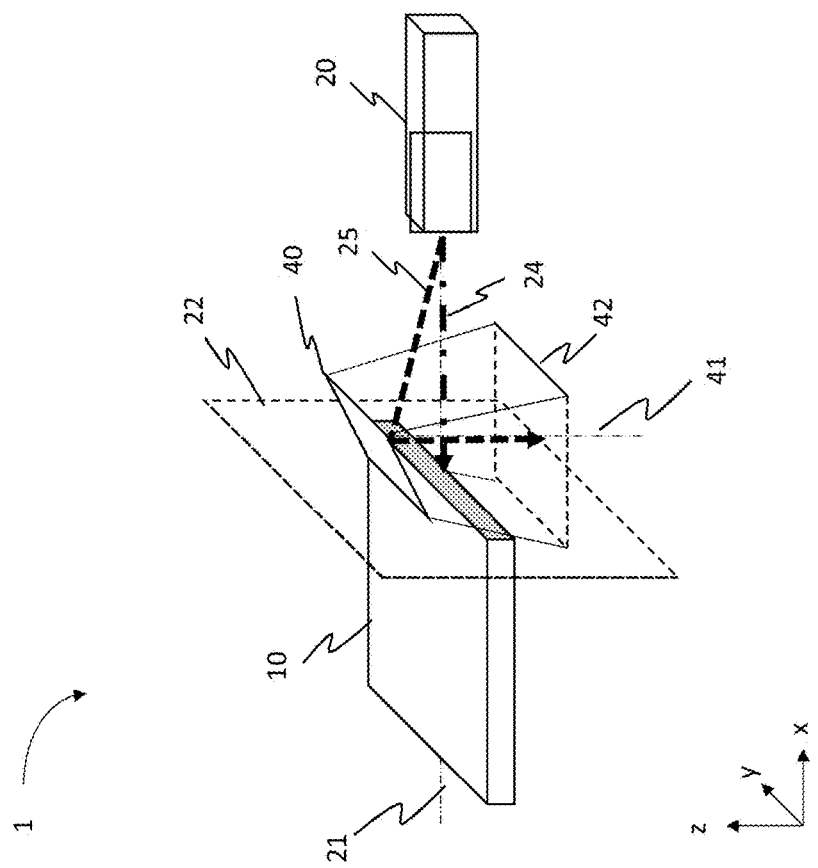
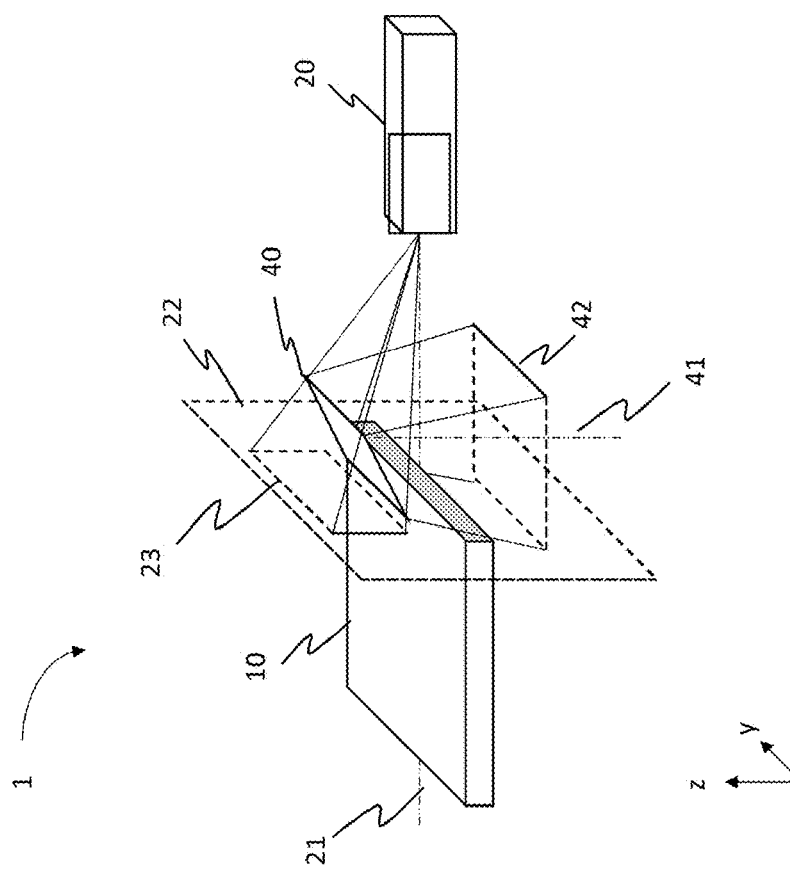

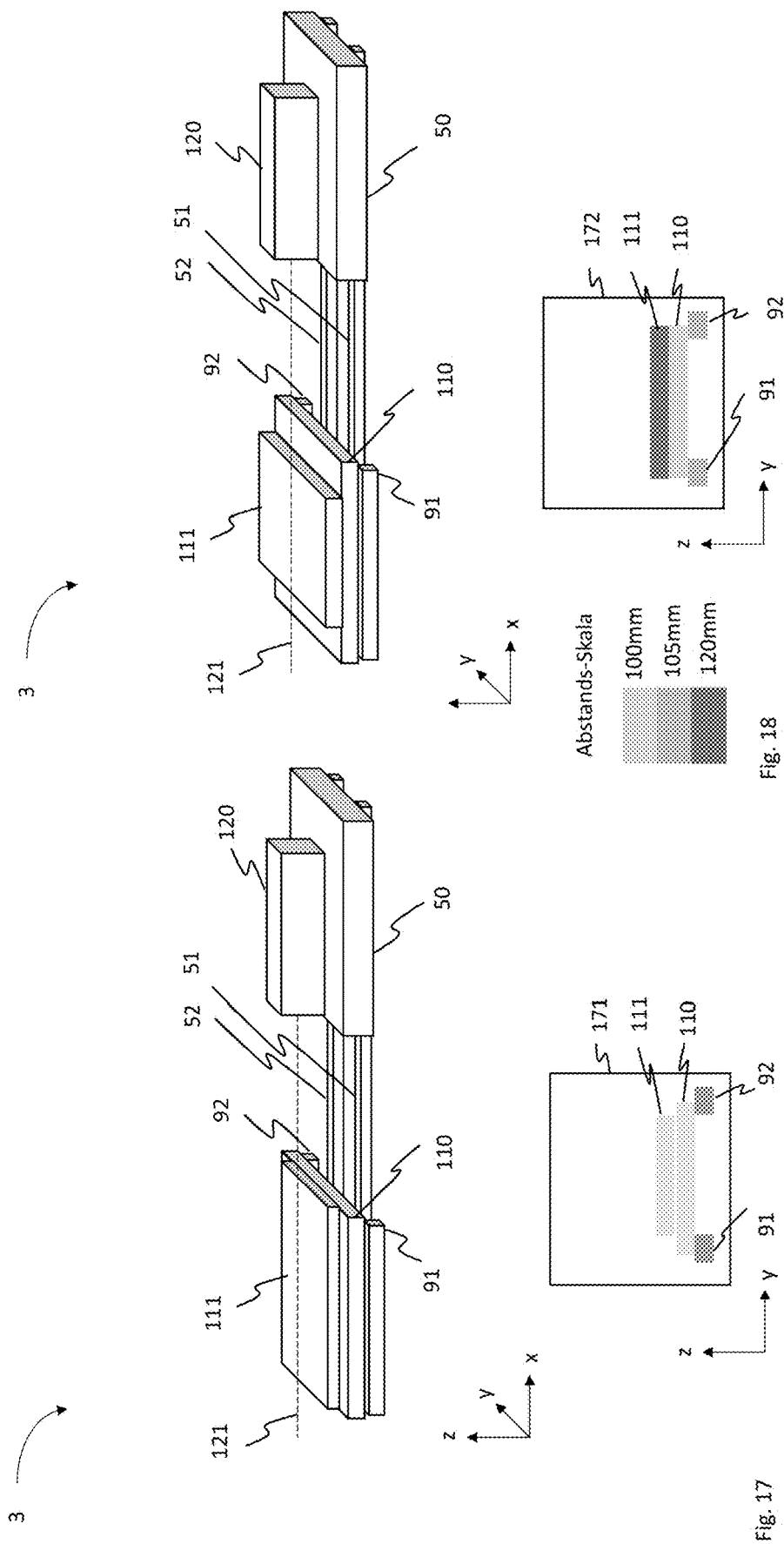

DEVICE AND METHOD FOR IMAGING AN OBJECT IN AT LEAST TWO VIEWS

The present invention relates to a device and a method for imaging an object in at least two views. The device and the method can be used, for example, to teach-in or to control a robot or to control handling systems or, more generally, with devices in which an image of an object is required for analysis or monitoring.

BACKGROUND OF THE INVENTION

Nowadays, devices and methods for imaging an object are used in a variety of ways in order to control or monitor equipment or machines. This also includes equipment in the semiconductor industry, for example, such as for processing substrates, in particular wafers, masks, or flat panel displays. Here, different handling systems such as robots are used, which comprise what is known as an end effector for gripping and placing a substrate, and which are used to move the substrates to be processed from one processing station to another. Such robots usually move the end effector in multiple spatial directions, and it is often necessary to teach the robot for particular equipment, i.e. to store therein at least one trajectory and/or at least one target position of a movement curve.

In such an adjustment procedure which is also known as "teach-in", the robot is taught a movement sequence and/or is mechanically adjusted for a movement sequence, which it will then perform during operation of the equipment. Teach-in in particular includes to teach a target position at which the substrate shall be placed by the robot. For many robots, the teach-in is performed manually while the motor axes are powered. It will be appreciated that the teach-in also considers the other components or parts of the equipment provided in the system.

The teach-in process can be performed under visual control by an operator, and the movement curve or trajectory is performed by a multitude of smaller individual steps, in particular the radial and theta movements. Since this is very complex and also prone to errors and may even cause major damage to the system, optical monitoring of the teach-in process is increasingly being employed, for which cameras are used which capture images of the substrate and/or of the end effector, and also images of other objects. Optical monitoring can also be used to monitor the equipment during operation, for example to supervise a robot in this way.

Accordingly, such optical monitoring is based on the use of at least one camera for the teach-in of a robot, for monitoring a robot or equipment, for identifying substrates, for example the type of a substrate, the presence ("mapping") of the substrate, its position and/or orientation, for measuring the position of or distances to the substrate and/or other objects. First, images or videos are captured, followed by manual evaluation or evaluation by image processing, or else evaluation using neural networks.

For example, Applicant's documents EP 3 648 150 A1 or EP 3 648 152 A1 disclose methods for teaching or controlling a robot for moving a wafer or a mask or a flat panel display, which use cameras and rule-based image processing for identifying objects, especially substrates such as masks (reticles), wafers, or flat panel displays.

Furthermore, documents DE 10 2020 112 146.6 or DE 10 2020 112 149.0 disclose methods for teaching or controlling a robot for moving a wafer or a mask or a flat panel display, which also use cameras. Instead of or in addition to rule-based image processing, however, artificial neural networks are used to identify objects, in particular substrates such as masks, wafers, or flat panel displays.

All these methods have in common that at least one camera is required to capture images and convert them into digital image data, which can then be displayed, processed or assessed.

The cameras generally used for this purpose are capable of sufficiently sharply imaging objects in the imaging plane of the camera. This imaging plane typically lies perpendicular to the optical axis of the camera.

This makes it possible to image objects or portions thereof or geometric properties (such as edges of the object) lying within this view or within the orientation of the imaging plane, or to detect or measure positions or distances to reference points within this plane.

However, it is often desired to not only obtain image information of the object from this imaging plane or this view, but also further information about the object outside of this imaging plane or view. This includes, for example, areas or portions of the object that do not lie in the imaging plane or can only be seen in a different view. For example, it is often also desired to image geometric properties or to identify or measure positions or distances to reference points that do not lie in the imaging plane.

It is possible to obtain such information via triangulation methods and in relation to objects of known dimensions located in the imaging plane. However, this indirect method is complex and will possibly be accomplished with reduced accuracy.

Alternatively, so-called 3D cameras could be used, i.e. camera systems which, in contrast to normal analogue or digital cameras operating in the two-dimensional domain, represent grayscale or color values of the objects, for example, and which then allow to calculate the desired image information on the basis of this information.

The use of so-called stereo cameras is also conceivable. In this case, the object is captured using two cameras simultaneously, and the distance between the camera lenses can correspond to the distance of human eyes. The resulting pair of images can then be processed in computer-assisted fashion in order to measure a distance on an object or between objects in this way.

In summary, these methods are all time-consuming to use, and often also expensive, for example if particularly complex cameras are used, or if a plurality of cameras have to be provided or employed.

Moreover, 3D cameras are not able to image any possible views that might be important, for example a rear view or an obstructed view of objects, i.e. object areas on the side of the object facing away from the camera or, more generally, views that do not lie in the object space of the camera.

Accordingly, what is desired is to have methods for imaging an object with high accuracy and without the drawbacks mentioned above.

More particularly, it is desirable during imaging of the object to allow for not only capturing and analyzing one view of the object but also views that do not lie in the object space of the camera, such as rear side or obstructed views of the object.

It is furthermore desirable to be able to use simple and cost-effective cameras, preferably only a single camera, and preferably also a camera operating in the two-dimensional domain.

The inventors have addressed this task.

This task is solved in a surprisingly simple way by a device and a method according to any one of the independent claims for simultaneously imaging an object in at least two different views. Preferred embodiments and refinements of the invention will be apparent from the respective dependent claims.

Accordingly, the subject-matter of the invention encompasses a device for simultaneously imaging an object in or by at least two different views, the device comprising
at least one imaging optical element, and
at least one reflective element,
wherein the reflective element is at least partly arranged within the object space of the imaging optical element,
wherein the optical axis of the imaging optical element is associated with the first view of the object,
and wherein the reflective element is operable to image a second view of the object, which is different from the first view.

In a further aspect of the invention, the invention also encompasses a method for simultaneously imaging an object in at least two different views, for which a device according to the invention as explained above is used.

The device according to the invention and the method according to the invention are particularly suitable for use in or together with a machine, equipment, a processing machine, a semiconductor industry system, or a machine of the semiconductor industry.

This includes, for example, machines, equipment, or systems that are suitable for processing substrates in or in conjunction with the semiconductor industry. This includes, for example, machines for processing substrates, for lithographic processes, for inspection, for measurement, for storage, for transport, for producing substrates, or machines that perform measures on or with the substrates in any other way. In particular machines used in what is known as the flat panel industry shall also be encompassed here.

A further aspect of the invention relates to solar cells or solar panels, in which case the machine, equipment, or system can similarly be intended for use in the solar industry.

Accordingly, a machine may comprise a robot, for example, which can be employed in the semiconductor industry. In the present context, equipment is understood to mean a more complex unit, which may include a machine, for example a processing station that comprises a robot. Finally, in the present context, system is understood to mean a yet more complex entity which can include equipment. It can be understood to mean all devices, machines and equipment cooperating with the device of the invention or interacting with the device.

In the present context, object generally refers to at least one item or body such as a substrate, but also to a part of an object, to a constituent or component, for example as part of the device, machine, equipment or of the system.

For example, object also refers to supports for substrates, to robots, end effectors, forks of end effectors, to other grippers, to transfer units such as stages for substrates, chucks for substrates, units for rotating or aligning substrates, to storage stations for substrates, load ports, vacuum chambers, locks, any other components of a processing machine, including auxiliary components such as transport containers or parts thereof, such as those which can be used to transfer substrates to or from a processing machine.

As far as the term object is used in the present context, it shall also encompass a plurality of objects or items, or a part of an object or item, for example it can refer to a substrate such as a wafer, or to a part of a gripping device or of an end effector. For a distance measurement it may be useful, for example, to image at least two objects.

End effector refers to the component on or at a robot, which is designed to grip, hold or pick up a substrate. Typically, an end effector is mounted to an arm of a robot for this purpose. Sometimes, the end effector itself is referred to as an arm or as a gripper or gripping device in this context.

The term substrate is understood to mean items that are used in the semiconductor industry or in the flat panel industry in the present context. These include, for example, wafers, masks, for example for photolithographic processes, or else flat panel displays, or else solar cells or solar panels. Such substrates may moreover include additional parts, add-on structures or other components, for example pellicles in the case of masks, add-on structures such as measurement setups for machine setup or calibration, or for the inspection of machines, or for other purposes required in the semiconductor industry.

The substrates may also be arranged on carriers, for example on foils, or they may be clamped in a frame or placed on a support, for example on a metallic or ceramic support, and may be used, processed or moved in machines along with the aforementioned elements.

The substrates may also be stacked directly on top of one another, for example wafers which are functionally connected to one another can lie on top of one another. The substrates may also be present in multiple parts, for example wafers are commonly cut into sections in certain process steps in the semiconductor industry, and such sections might be attached on a carrier.

According to a further aspect of the invention, the invention therefore also encompasses a machine, equipment or a system as described above, preferably for use in the semiconductor industry, which comprises a device according to the invention.

It will be obvious to a person skilled in the art that the device of the invention can be employed not only in or with the machines, equipment or systems mentioned above. Rather, other machines, equipment or systems are likewise conceivable, in which an object is to be imaged in a time-saving and cost-effective manner with little effort, and in which the object is desired to be captured in at least two different views. Such machines, equipment or systems can also benefit from the advantages of the device according to the invention.

In the sense of the invention it is favorable for the object to be located at least partly in the object space of the imaging optical element during operation of the device, in particular during image capturing, so that it can be captured accordingly. The object space of the imaging optical element, also known as the field of view or image area, refers to the set of all objects or object points that can be imaged by the imaging optical element.

The term imaging plane refers to a specific area in the field of view or object space of the imaging optical element, such as a camera. Here, the imaging plane refers to that area in the object space of the imaging optical element in which the object can be imaged sufficiently sharply. In the present context, sufficiently sharply means that the sharpness is sufficient for an analysis or evaluation.

For example, it can be read out from a camera as an image or video. Here, the optical axis of the imaging optical element defines the viewing direction of the imaging optical element. The imaging plane is usually perpendicular to the optical axis. In the context of the present invention, the object space of the imaging optical element is also referred to or associated with the first view of the object.

According to the invention, it is contemplated for the reflective element to be located at least partly in the object space of the imaging optical element, at least when images are to be captured. The reflective element is preferably adapted and arranged in such a way that a further, second view of the object and/or of other objects can be imaged by virtue of the reflective element. This second view of the object preferably differs from the first view, so that two different views of the object can be imaged simultaneously during operation.

Thus, it is intended according to the invention to provide a reflecting element, for example a mirror, which deflects part of the imaging plane or of the object space of the imaging optical element in a different direction, so that an object space with a different imaging plane is created within the object space of the imaging optical element. With just a single two-dimensional camera which, for example, only images one plane perpendicular to the optical axis, it is possible surprisingly easily to add a further imaging plane.

In this way, the device can be manufactured in a particularly simple and cost-effective manner, for example by using only one imaging optical element which operates in the two-dimensional domain and which accordingly generates a two-dimensional image of the object. Here, the term two-dimensional imaging optical element refers to an imaging optical element, for example a camera, which has a two-dimensional image sensor or which only generates image points in a two-dimensional coordinate system. The individual pixels may include gray values, RGB values or infrared values or other values, but no additional information about the distance of a pixel, for example relative to the imaging optical element.

Imaging optical element or capturing element refers to an apparatus or device which is suitable for capturing an image, storing it and converting it into digital signals, in particular into digital image data or image information, for further processing. Accordingly, the capturing element may comprise a camera, preferably a 2D camera or two-dimensional camera, a video camera, or an image sensor.

According to the invention, a single imaging optical element working in the two-dimensional capturing domain is sufficient. This already allows to image parts or geometric properties such as object edges within the orientation of the imaging plane, i.e. in the viewing direction along the optical axis, or to simultaneously capture or measure positions or distances to reference points, when the second imaging plane is also imaged.

This provides a cost-efficient and simple way of imaging even an object or geometric properties of an object that is not located in the imaging plane of the capturing element, or of detecting or measuring positions or distances to reference points, which cannot be determined from a single view of the object alone.

According to the invention, the reflective element is effective to add, to the first view which is defined by the orientation of the optical axis of the capturing element, a further viewing direction and hence a second view, which is also referred to as a further, second optical axis. In the present context, the optical axis of the imaging optical element and the second optical axis are also referred to as the first and second viewing axes. The two viewing axes or views may lie orthogonal to one another, for example. However, it will be appreciated that a wide variety of alignments and arrangements of the imaging optical element and the reflective element relative to one another are possible. Within the meaning of the invention, the at least two viewing axes can also lie parallel to one another, preferably with a lateral offset to one another, or at an angle to one another. However, they are generally not coaxial to one another, since two different views cannot be displayed in this case.

This allows to image objects, for example edges that are visible, also in their depth, i.e. in their extent parallel or approximately parallel to the optical axis of the imaging optical element, and/or to determine positions or angles relative to the imaging optical element on the basis of known dimensions with respect to the imaging optical element or a reference point.

The reflective element is mounted relative to the imaging optical element preferably in such a way that it lies in that area in the imaging plane of the imaging optical element, which relates to an object space that is not or only slightly relevant for the operation of the device.

For example, a front edge of an object can be imaged very well by a two-dimensionally operating capturing element if this edge lies in the imaging plane of the capturing element. The invention now makes it possible to additionally image an item which, for example, lies on a planar surface of the object, for example a pellicle on a mask, and for example to exactly measure the distance to the front edge of the object, when the reflective element is used to image the surface of the object with the item lying on top of it and along with the front edge.

In the sense of the invention, the reflective element is used to image a second view of the object and to virtually copy or mirror it into the object space of the single capturing element, and this second view of the object is different from the first view. In other words, the second view is not identical to the first view, corresponding to a view from a viewing direction towards the object that differs from that of the first view.

It can be advantageous if the second view allows to at least partly image areas of the object that are not in the object space of the capturing element during operation thereof. This means that the reflective element is arranged so as to image, into the object space, a view of the object which would not be present in the actual object space of the capturing element, i.e. without a reflective element in the object space. For example, the capturing element may be aligned such that its optical axis is directed onto a front edge of an object such as a substrate, for example, and the reflective element can be used to generate a further view which is directed at the surface of the object or substrate.

This allows in a particularly simple way to add a second view or dimension to the first view of the capturing element, so that image information can be generated in a virtually three-dimensional manner.

In this case it is favorable for the reflective element to be arranged in the imaging plane of the imaging optical element. In this way it is possible during operation or at the time of image capturing to be able to capture, sufficiently sharply and simultaneously, both a specific area of the object according to the first view and a further area of the object according to the second view as imaged by the reflective element. For this purpose, the reflective element may particularly favorably comprise at least one reflective surface for imaging the second view of the object, which surface can be planar in a preferred embodiment of the invention.

This makes it possible, during operation and/or during image capturing, to use a single imaging optical element to simultaneously capture at least the first view according to the optical axis of the capturing element and the second view of the object, which can be copied into the imaging plane of the capturing element by virtue of the reflective element.

In other words, it is intended within the sense of the invention to complement the viewing direction of the capturing element, i.e. the first view, with a further, second view. This second view can be predefined by the position and orientation of the reflective surface of the reflective element relative to the optical axis and the imaging plane of the capturing element.

In one embodiment of the invention, in order to allow for different viewing directions towards the object in the first and second views, a viewing axis corresponding to the first view of the imaging optical element, i.e. the optical axis of the imaging optical element, and the viewing axis corresponding to the second view as defined by the reflective element, enclose an angle $\alpha$ between each other. This means that the two viewing axes are oriented at an angle relative to each other, so that the following applies: $\alpha>0°$.

Even a slight inclination, for example with an angle $\alpha=5°$ or $\alpha=10°$ between the two viewing axes or views, may allow to image a further, second view of the object, which differs from the first one. Larger angles from approximately $\alpha>70°$ can turn out to be advantageous, for example in order to provide for a top view of the object in addition to a front view thereof. For example, an angle of $\alpha=90°$ allows for a second view that is orthogonal to the first view. Even larger angles $\alpha$ make it possible to image rear areas of the object, for example even undercuts.

According to a further embodiment of the invention it is intended to provide at least one marker, for example arranged on or at the device or in the area surrounding the device, for example on or in the machine, equipment or system. In this context, a marker is understood to mean a predefined or previously known marking which is recognizable or can be imaged by the capturing element. Markers can be placed within a processing machine as orientation points or reference points.

The markers may, for example, be geometric figures, such as lines, crosses, rectangles, arrows, or characters. The markers can be applied on parts or components of the device, for example printed onto it, milled into it, etched into it or painted onto it, or they can be provided on sticker labels, for example. However, it is also possible to use recognizable geometric or color properties of objects as markers. In the sense of the invention, it is favorable if the position of a marker relative to an object and/or to the device is known.

In principle, the markers can be found at different locations on or at the object or substrate, on or at the device, on or at the machine or parts thereof, on or at the equipment, on or at the system, for example on stationary or moving objects, constituents or components of the device, for example also on parts of the end effector. During operation of the device, these markers can be used to detect relative or absolute positions. Therefore, they are advantageously arranged so as to lie in the object space of the capturing element when an image is captured.

Here, relative position refers to the distance between at least two objects in all six degrees of freedom x, y, and z, and the corresponding angles. The position of an object is defined with respect to a reference point or zero point defined for the device, in all six degrees of freedom.

Relative positions or distances can be determined visually or automatically using image processing by having at least two features, for example markers or recognizable geometric elements of objects such as edges located within the object space of the capturing element, and determining the distances between these features in the image, for example visually or by an image processing procedure. In this case, the distances can be expressed in terms of pixels of the image, or else they can be represented numerically, for example in mm or degrees, if reference data are known. The underlying methods, such as triangulation, are well known to those skilled in the art and will not be discussed in greater detail here.

Accordingly, the position of movable points or else the position of a movable capturing element can be determined in absolute or relative terms. The at least one marker is therefore preferably arranged within the object space of the capturing element, so that it can be imaged.

According to one useful embodiment of the invention it is intended to arrange the reflective element on an end effector of a robot. This allows to determine the position of the end effector relative to an object in a direction along the optical axis, i.e. the relative distance between the object and the capturing element, as soon as the object, such as a recognizable edge of a substrate, is located within the imaging plane of the capturing element, for example when the end effector approaches the object.

An identification of the distance between the end effector and the object is made possible by knowing the mechanical positions, orientations or angles of the capturing element or its optical axis and of the reflective element on the end effector, which allows to determine the relative distance on the basis of the pixel position of the detected edge in the imaging plane of the capturing element. Additionally, image processing can be used for this purpose, for example. However, it is also possible to manually determine the relative distance on a display, for example by determining the pixel positions. The distance may also be assessed purely visually, for example when teaching-in a robot.

According to one embodiment of the invention it is intended to arrange at least one marker M1 on the fork of the end effector. This allows to simplify the identification of the relative distance, for example visually, or else the manual determination on the display, or merely the computer-assisted image processing. According to a further embodiment it is intended to attach the marker M1 at a different location on the end effector which is not associated with the fork.

According to yet another embodiment it is intended to arrange at least one marker M2 at a reference position in the imaging plane of the capturing element or in a further imaging plane. For example, if this marker M2 is attached to a stationary part within the device, this allows to determine the position of the end effector in the device in absolute terms.

According to yet another embodiment it is intended to arrange at least one marker M3 on the object, preferably within the imaging plane of the capturing element or in the further imaging plane. This also allows to determine the relative distance of the end effector relative to the object along the optical axis of the capturing element as soon as the marker M3 is located in the imaging plane. More generally, any markers can be arranged in any imaging planes, and preferably their position relative to other objects should be known in absolute or relative terms.

According to a refinement of the invention it is contemplated to arrange more than one reflective element within the object space of the capturing element. This at least second reflective element makes it possible to image at least one additional, third view of the object during operation, and the aspects mentioned above, for example with regard to the arrangement in the object space or the alignment, similarly apply to the additional reflective element. Consequently, this at least third view can differ from the at least two other views, i.e. the first and second views. Advantageously, the at least third view allows to at least partly image areas of the object which are not or not completely located within the object space of the capturing element or in the second view.

It will be obvious to a person skilled in the art that it is likewise possible to connect a plurality of reflective elements in parallel, or else to arrange them serially, one behind the other. For example, a serial arrangement makes it possible to first image a rear view of an object via a further, second reflective element onto a reflective element which can be arranged within the object space and in the imaging plane of the capturing element. Furthermore, it will also be obvious to a person skilled in the art that it is also possible to connect a plurality of reflective elements in parallel and/or in series. This allows to simultaneously display even more than two views using the device of the invention.

The at least one imaging optical element can be arranged in a permanently fixed or else detachable manner on the device, for example on a robot or on an end effector of a robot. According to one embodiment it is moreover intended for the at least one imaging optical element to be arranged in a fixed or detachable manner in the area surrounding the device, i.e. for example on the machine, equipment, or in the system.

The at least one reflective element can be arranged in a permanently fixed or else detachable manner on the device, for example on a robot or on an end effector of a robot. However, it can also be attached in a permanently fixed or detachable manner in the area surrounding the device, for example on the machine, the equipment, or in the system. In the case of more than one reflective element, these elements can be arranged at different locations in the system. This allows, for example, to determine the position of the object by virtue of the imaging optical element on the end effector. Markers M1, M2, and/or M3 can additionally be used for this purpose.

It will be obvious to a person skilled in the art that a variety of possible combinations or arrangement variants can be derived from this.

Here, the basic principle of the invention is that the reflective element allows to create a "picture-in-picture" solution, which allows to produce a further viewing direction in a second view of the object while using a two-dimensional imaging optical element. This permits to image a third dimension in a simple and cost-effective manner, which can be used for visual, manual, or automatic further processing, preferably using computer-assisted image processing.

It is possible within the sense of the invention to employ different numbers of imaging optical elements or different numbers of reflective elements. Also, they can be attached in different ways, including stationary, or mounted on the end effector or on other parts or components of the machine, equipment, or system, including moving ones.

In other words, the invention serves to generate at least a second sub-image field with a different orientation and/or position of the optical axis or viewing direction within the image field or the object space of a preferably two-dimensional imaging optical element.

According to a further embodiment of the invention it can also be advantageous to only change the position or location of the second optical axis, regardless of its orientation, for example in order to get objects into the object space or into the imaging plane of the imaging optical element, which are not visible with an optical axis that has not been changed in its position or location. In this case it is also possible that the first and the second views are parallel to one another, so that the following applies to the angle $\alpha$: $\alpha=0°$. Accordingly, in this embodiment of the invention, both viewing axes will be arranged parallel to one another, but laterally offset from one another.

Such an arrangement makes it possible to view, in the second viewing direction along the second viewing axis, even areas that are laterally offset from the object and may be obstructed by the object.

According to a further embodiment of the invention it is intended to arrange the at least one capturing element on the device in such a way that at least a first fork of an end effector and/or a first support is located within the object space of the capturing element, and so that at least one straight line corresponding to at least one ray of light that can be imaged by the imaging optical element runs parallel or approximately parallel to at least one fork and/or to at least one support in a plane spanned by spatial directions x and y, and with an angle $\beta$ between this at least one light ray and the fork and/or support amounting to not more than +/−10°, preferably not more than +/−5°, and most preferably not more than +/−2°. For this purpose, the capturing element can particularly favorably be arranged on or at the end effector.

Such an arrangement also makes it possible to determine lateral distances between the fork of an end effector or other forms of support for a substrate on an end effector to another support in the system, since the distance will be visible and will not or only slightly be obstructed by the fork of an end effector or another form of a support for a substrate on an end effector. The support may also comprise a support in the equipment or system.

In the following, it will be assumed that the imaging plane of the imaging optical element is spanned in two spatial directions referred to as y and z. The third spatial direction x shall extend perpendicular to the imaging plane and thus corresponds to the optical axis of the capturing element. According to this embodiment, the capturing element is arranged such that the optical axis is at an angle to the orientation in z-direction and at an angle to the orientation in y-direction. Furthermore, it is advantageous in this particular embodiment if the capturing element is offset in the z-direction relative to the areas to be imaged of the object.

In this way it is possible to image and analyze a gap, for example between a substrate, forks, and/or an end effector using only one capturing element, and to determine the relative position of the forks in all degrees of freedom x, y, z, and angles of the forks of the end effector relative to one another. If dimensions of, for example, a support are known, it is also possible to determine dimensions of a gap in this way, for example. This is particularly favorable if, for example, the exact alignment of an end effector or of forks have to be taken into account when a substrate is picked up from a support and/or when a robot moves and/or when the object moves at any point in time of the movement in order to prevent any damage, for example of the substrate, the object, the fork, or the support, or of other parts or components of the equipment or system. Since the supports may similarly be located within the object space of the single capturing element, it is possible to determine the positions of the supports relative to one another and relative to the capturing element and/or to the end effector.

In a further embodiment of the invention, the at least one imaging optical element may also be aligned in such a way that a gap, the forks, and the supports can be seen without angular rotation about the z-axis, by having the optical axis aligned at least approximately in line with the gap.

However, a drawback of such an arrangement is that the field of view of the camera has to be larger in this case, which will result in the generation of a region of the field of view, which is not required or not necessarily required. In order to achieve the same resolution of the image plane or of the field of view (and thus the same accuracy in determining positions or distances) as with an angular orientation, greater pixel resolution of the camera will be required.

In one embodiment of the invention, mounting the capturing element and/or the reflective element in a detachable manner can provide for an easy exchange thereof. This can be beneficial if the device is used for different purposes. For example, it may be advantageous to use other, higher-resolution capturing elements and/or a plurality of reflective elements allowing for the imaging of a plurality of views for the teaching-in, and to provide other capturing elements or less reflective elements once the teaching-in has been concluded successfully.

The capturing element is capable of generating a two-dimensional image of the object in digital form. For this purpose, the capturing element may comprise a camera, preferably a 2D camera, a video camera, or an image sensor or any other device that is capable to digitizing images using an electronic image converter. The digitized image can be used for visual, manual, or automatic analysis, and combinations thereof are of course possible as well in the evaluation.

One aspect for the selection of the imaging optical element, besides the orientation of the imaging plane, is the size of the imaging plane. The latter is determined by factors such as the optics that are used, the size of the image capturing sensor of the capturing element, and the distance between the imaging plane and the capturing element, inter alia. Depending on the design, it may be the case that, without further measures, the imaging plane of the imaging optical element does not cover all of the areas that are desired to be viewed. In this case, it is possible to use further imaging optical elements, or to move the imaging optical element by means of a suitable mechanism, or, for example if the imaging optical element is attached to an end effector, to move it by virtue of the end effector which is moved by the robot, so as to capture images from different positions using the imaging optical element.

For this purpose, the device may comprise a display element for visualizing the captured image for a user, and/or computer-assisted image processing means for further analysis of the captured image. The computer-assisted image processing can be performed both by a computer unit integrated in the device, as well as by a computer unit arranged separately from the device. This may also include storing the digitized images in a cloud, from where these images can be fed to image processing means which in turn can be accommodated at a different location.

In the context of the invention, image processing encompasses any procedures for computer-assisted evaluation of image information, such as processes for edge detection or pattern recognition, and also procedures, which, for example, can be employed in freely available libraries, such as OpenCV, or procedures involving neural networks or artificial intelligence.

The image information can directly be derived from a camera in the form of an image or a live video stream, for example, or it may include stored images or videos. Also encompassed is the modification and/or pre-processing of such images, which is sometimes necessary for the evaluation of images. This includes, for example, augmentation, i.e. the transformation of image information, conversion of color images into greyscale images, alteration of the image size or of the contrast.

According to a particularly preferred embodiment of the invention, the reflective element may comprise an optical means that is capable of reflecting and/or deflecting electromagnetic radiation, preferably in the visible wavelength range, including a mirror, a prism or some other planar reflective surface. Hence, the reflective element is preferably designed to reflect or deflect a light beam. The degree of deflection or the angles of incidence or reflection determine the extent of change between the viewing axis of the imaging optical element and the second viewing axis corresponding to the second view.

According to one refinement of the invention, the reflective element can be semi-transparent at least in sections thereof, preferably semi-transparent in the visible wavelength range. For example, partially transparent or semi-transparent mirrors are known, which allow areas behind the mirror to still be visible to the capturing element. This can be of interest if the object space of the imaging optical element should not to be completely obstructed by the reflective element.

According to one embodiment of the invention, the reflective element may favorably comprise at least one further optical means for selecting the incident electromagnetic radiation, in particular a filter, a polarization filter, an infrared blocking filter, a UV blocking filter, a color filter.

This allows to suppress or emphasize certain wavelength ranges of the electromagnetic radiation. For example, this makes it possible to use the device of the invention in environments with temporarily strong sunlight.

Selective controlling of the sharpness can be helpful if the different imaging planes or image fields as generated by the reflective element have a different distance from the imaging optical element. For a given viewing distance, i.e. for a given depth of field of the imaging optical element, this can mean that the different areas of an image cannot all be imaged equally sharply.

According to yet another embodiment of the invention, the reflective element may therefore comprise at least one further optical means for controlling the sharpness, preferably a lens, optics, or an objective lens. As an alternative or in addition it is also possible for the reflective surface to not be planar, but rather shaped accordingly, for example curved or angled. It is also possible to use two combined reflective elements for the angled implementation, for example.

According to yet another embodiment, the reflective element may also be shaped so as to produce magnifications or reductions in size. This allows, for example, to zoom into or magnify small image sections using the reflective element.

Depending on how the device of the invention is used, it may be helpful or even necessary to illuminate the object or the area surrounding the object to be imaged in an image. For this purpose, light sources can be used, which are installed in the vicinity of the device or of the imaging optical element, or at a greater distance from the imaging optical element. Light sources often already have a reflector that is capable of directing the beam path of the light source or part thereof in a specific direction. For certain application cases it may be useful to illuminate the object to be imaged from at least one direction which is different from the direction of the beam path of the light source. According to the invention, the reflective element can also be used for this purpose.

Therefore, an illumination device is provided in a further embodiment of the invention, which is adapted to illuminate the object from a first direction. It will be appreciated that this embodiment can be combined with the embodiments mentioned above relating to the imaging optical element or the reflective element. In this case, the reflective element or the imaging optical element can be installed stationary in the area surrounding the device, or can be arranged so as to be movable, for example on the arm of a robot, or on an end effector.

For this purpose, at least one reflective element may be arranged at least partially in the beam path of the illumination device and oriented in such a way that at least part of the light from the illumination device is deflected and directed onto the object from at least one second direction.

It will be appreciated that it is likewise possible to provide the reflective element for deflecting the illumination direction with further optical properties, such as curvatures, or optics that are able to alter the illumination beam path, for example so as to further widen or to focus the beam path, or as a beam splitter in order to produce multiple directions.

The method according to the invention for simultaneously imaging an object in at least two different views is based on the device according to the invention as explained above.

It allows to capture and image an object in different views simultaneously, but it is also possible to split a view of an imaging optical element into different views, irrespective of whether the one object will then be visible in different (partial) views, or completely different objects or parts of objects.

The device according to the invention can be employed in or together with a machine, equipment, or a system, preferably for use in the semiconductor industry.

The images captured with the aid of the device can be used for teaching-in, for controlling, for monitoring, and/or for checking the equipment, the system, or the machine of the semiconductor industry. For example, this also includes the controlling, adjusting, teaching-in or checking or monitoring of a robot.

For example, this makes it possible to provide a method for teaching-in and/or controlling a robot for moving a wafer or a mask, or a flat-panel display, in which at least one camera is used which captures the movement of the robot and/or of the wafer or the mask or of the flat panel display, preferably by detecting the wafer, the mask, or the flat panel display, and/or by detecting the support for the wafer, the mask, or the flat panel display, and/or by detecting markers in processing equipment for wafer, masks, or flat panel displays by at least one camera.

Methods of this type have been disclosed in Applicant's documents EP 3 648 150 A1 or EP 3 648 152 A1, which are hereby incorporated in their entirety into the subject-matter of the present invention by reference.

Furthermore, this also makes it possible to provide a method for processing substrates, in particular wafers, masks or flat panel displays using a machine of the semiconductor industry which uses an artificial neural network to determine the presence and/or the position and/or the orientation and/or the type of a substrate, for identifying the presence and/or the position and/or the orientation and/or the type of the substrate on the basis of at least one image that represents a location in or on the semiconductor industry machine or in the area surrounding the machine, at which a substrate can be located during operation of the semiconductor industry machine,
 wherein the at least one image is captured by at least one capturing unit,
 and wherein the artificial neural network generates or provides for
 an information data set comprising information about the determined presence and/or position and/or orientation and/or type of substrate,
 and/or a control command which is used to directly control the semiconductor industry machine,
 or is used by the machine's control system,
 or is forwarded to a higher-level control system,
 or is forwarded to an operator who draws conclusions from this information for his actions to operate the machine,
 or forwards this information to control units or to other operators,
 or is stored for later or further evaluation.

Such a method is described in Applicant's document DE 10 2020 112 146.6, which is hereby incorporated in its entirety into the subject-matter of the present invention by reference.

Furthermore, this also makes it possible to provide a method for monitoring or controlling handling systems, in which at least one image representing a location in or on the handling system or in the area surrounding the handling system is captured in digitized form by an artificial neural network, and in which the image is analyzed by the artificial neural network and an information data set and/or a control command is generated, which is used to control, align, train-in and/or monitor the handling system directly or in a supportive manner, and/or in which this information data set is used to align, train-in or control the handling system.

Such a method is described in Applicant's document DE 10 2020 112 149.0, which is hereby incorporated in its entirety into the subject-matter of the present invention by reference.

Further details of the invention will be apparent from the description of the illustrated exemplary embodiments and the appended claims.

In the drawings:

FIG. 10 is a schematic perspective view of the device according to the invention from FIG. 2;

FIG. 11 is a schematic perspective view of the device according to the invention from FIG. 2;

FIG. 17 is a schematic perspective view of a further device comprising an optical element 120 that is operating in the three-dimensional domain; and FIG. 18 is a further schematic perspective view of the device shown in FIG. 17.

DETAILED DESCRIPTION OF PREFERRED EMBODIMENTS

Figure 2:
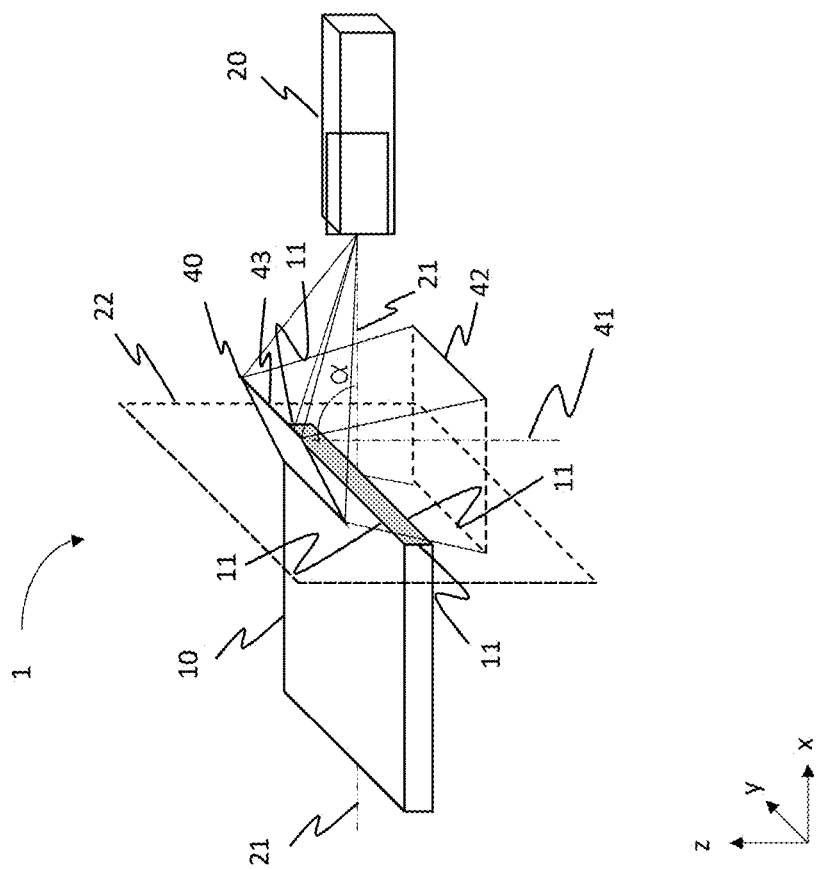
FIG. 2 is a schematic perspective view of the arrangement of a device according to the invention comprising an imaging optical element, a reflective element, and an object.

In the following detailed description of preferred embodiments, the same reference numerals designate substantially similar parts in or on these embodiments, for the sake of clarity. However, in order to better explain the invention, the preferred embodiments illustrated in the figures are not always drawn to scale.

The invention relates to a device and a method for simultaneously imaging an object in at least two different views.

Figure 1:
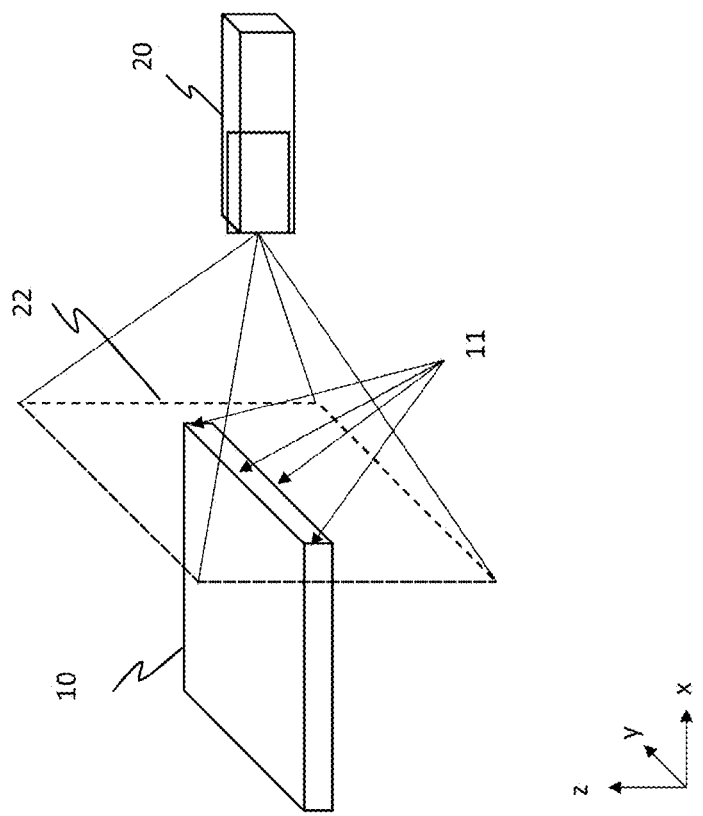
FIG. 1 is a schematic perspective view of an arrangement of a device comprising an imaging optical element and an object.

FIG. 1 is a schematic perspective view for basic comprehension, showing an arrangement of a device comprising an imaging optical element 20 and an object 10. Also indicated in this exemplary embodiment are edges 11 of the object 10, which are recognized by the imaging optical element 20 and the position of which is to be determined relative to the imaging optical element 20 in terms of the three degrees of freedom x, y, and z, as well as the three solid angles. The imaging plane of the imaging optical element 20 is denoted by reference numeral 22.

FIG. 2 also shows a perspective view which schematically illustrates an exemplary embodiment of the present invention with an arrangement of a device 1 according to the invention.

The device 1 according to the invention comprises an imaging optical element 20 and a reflective element 40, wherein in this exemplary embodiment the reflective element 40 is arranged entirely within the object space of the imaging optical element 20, and the object space of the imaging optical element 20 is associated with a first view of the object 10, and during operation of the device 1 the reflective element 40 is capable of imaging a second view of the object 10, which differs from the first view of the object 10.

According to a further aspect of the invention, the invention also encompasses a method for simultaneously imaging an object 10 in at least two different views, which method uses the device 1 according to the invention.

The device according to the invention and the method according to the invention are in particular adapted or suitable for use in or together with a machine, equipment or system, in particular in the field of the semiconductor industry. In the present case, the device 1 according to the invention is adapted for use in a machine of the semiconductor industry, which comprises a robot that has an end effector.

The device according to the invention is particularly suitable for supporting the teach-in process for a machine, equipment, or system, in particular in the field of the semiconductor industry, i.e. for a teach-in or teach-assist process. In this context, the term teach-assist refers to the support of a teach-in or adjustment process.

Furthermore, the device according to the invention can be used together with such a machine, equipment or system for monitoring, i.e. for supervising and controlling purposes, whereby a very high level of accuracy can be achieved, down to about 1 µm.

In this context, the device according to the invention also makes it possible, for example, to detect changes in the machine, equipment or system in good time, and to prevent possible damage in this way. This can include, for example, changes to or in the device itself, such as a distortion in the fork of an end effector, or else changes to the equipment or system, such as damage to a support, which means that a substrate cannot be placed properly. The device according to the invention makes it possible to determine object dimensions or object positions, also relative to the device itself or relative to a support.

The device according to the invention can also be used together with such a machine, equipment or system for detection purposes, for example for pellicle detection, when substrates such as masks that are common in the semiconductor industry are used, which may have pellicles, for example, which may be present on different sides and in different orientations. For this purpose, it is suitable to use computer-assisted image processing for the detection, either additionally or exclusively.

Accordingly, the invention therefore also encompasses a machine, equipment or a system, preferably for use in the semiconductor industry, which comprises a device 1 according to the invention.

The object 10 may generally comprise an item or body. In the illustrated exemplary embodiment the object 10 is a substrate, for example a mask, a wafer, a flat panel display, or a solar cell, or a solar panel. Without being limited to the illustrated exemplary embodiment, the term object may also refer to a part, a constituent or component, for example as part of the device, machine, equipment or system, to supports for substrates, to robots, end effectors, forks of end effectors, others grippers, transfer units such as stages for substrates, chucks for substrates, units for rotating or aligning substrates, storage stations for substrates, load ports, vacuum chambers, locks, any other components of a processing machine, including auxiliary components such as transport containers or parts thereof, for example those which can be used to transfer substrates to or from a processing machine, for example.

The object 10 may also comprise a plurality of objects or articles, for example it may also refer to a substrate and to part of a gripping device or an end effector. For a distance measurement it may be useful to image at least two objects 10. As far as the imaging of an object in a view is mentioned in the present context, this is understood to mean that the object is depicted completely or only part thereof or in partial views.

The exemplary embodiment of FIG. 2 also depicts an imaging plane 22 which is to be understood as a specific area in the field of view or in the object space of the imaging optical element 20. In this case, the imaging plane 22 is that area in the object space of the imaging optical element 20 in which an object 10 can be imaged sufficiently sharply, provided it is located in this imaging plane. The imaging plane 22 lies in the plane identified by spatial directions y and z.

Furthermore indicated in the illustrated exemplary embodiment is the optical axis 21 of the imaging optical element 20, which defines the viewing direction of the imaging optical element 20 and thus the first view. The imaging plane 22 is perpendicular to the optical axis 21. In the view of FIG. 2, the front portion of the object 10 facing the imaging optical element is arranged within the object space of the imaging optical element 20 and is located in the imaging plane 22, so that this front portion including object edges 11 of the object 10 can be captured and imaged by the imaging optical element 20.

In this drawing, the reflective element 40 is also located within the object space of the imaging optical element 40. The reflective element 40 is adapted and arranged in such a way that a further, second view of the object can be imaged by virtue of the reflective element 40. In the drawing, this second view or the second viewing axis which is defined by the reflective element 40, is denoted by reference numeral 41. As is easily apparent from the illustrated exemplary embodiment, this second view of the object differs from the first view, so that two different views of the object 10 can be imaged simultaneously during operation.

In the illustrated exemplary embodiment, the first viewing axis corresponding to the optical axis 21 of the imaging optical element 20 and the second viewing axis 41 are at an angle relative to one another. However, they can also lie parallel to one another, in which case a lateral offset would be advantageous in order to achieve different views.

Consequently, the reflective element 40 creates a further object space with a different, further imaging plane 42 within the object space of the imaging optical element 20, which can be imaged simultaneously with the first view by the imaging optical element 20. This is already possible when using just a single imaging optical element 20 that operates in the two-dimensional domain.

The imaging optical element 20 may comprise a camera, preferably a 2D camera or two-dimensional camera, a video camera, or an image sensor. In the present example, a 2D camera is provided.

This provides a cost-effective and simple option for also imaging an object 10 that does not lie in the imaging plane 22, or a portion of an object 10 that does not lie in the imaging plane 22, and thus to also image geometric properties of an object 10, or to detect or measure positions or distances to reference points, which cannot be determined from a single view of the object 10 alone.

According to the invention, the reflective element 40 adds a further viewing direction and consequently a second view to the first view resulting from the orientation of the optical axis 21 of the capturing element 20. The associated viewing axes or views can be orthogonal to one another, for example, as shown in the exemplary embodiment of FIG. 2. However, it will be appreciated that other orientations and arrangements of the imaging optical element 20 and the reflective element 40 relative to each other are possible as well, so that other relationships of the corresponding viewing axes will result.

For example, this also allows to image an object 10, for example recognizable edges 11 of a front portion of an object 10 even in depth, i.e. along the extension in spatial direction x parallel to the optical axis 21, and/or to determine positions or angles relative to the imaging optical element 20 or relative to a reference point, or based on known dimensions with respect to the imaging optical element 20.

As can be seen in the exemplary embodiment, the reflective element 40 is arranged relative to the imaging optical element 20 in such a way that it is located in that region of the imaging plane 22 of the imaging optical element 20 which corresponds to an object space that is not or only slightly relevant for the operation of the device 1.

In the exemplary embodiment, the reflective element 40 is provided with a reflective surface 43 which is particularly well suited for imaging. In the exemplary embodiment, this surface 43 is planar, so that the imaged second object space can be imaged without optical alterations such as distortions. However, it is also possible to provide a curved reflective surface 43 instead of a planar surface, which allows to increase the design options for the partial image. This can be useful if the partial image is to be displayed with magnification.

In the present case, the reflective element 40 is a mirror. However, other implementations which allow to reflect and/or deflect electromagnetic radiation, preferably in the visible wavelength range, are possible as well, for example a prism or some other reflective surface.

The size of the reflective surface 43 is conveniently based on the available installation space, the size of the utilizable object space of the imaging optical element 20, the resolution behavior of the imaging optical element, or the size of the object space desired to be imaged in the second view.

Suitable sizes of the reflective surface 43 or of the reflective element 40 can start at just a few millimeters, for example from about 3×3 mm, 1×1 cm, or in a range of about 5×5 cm, but may also be significantly greater, for example about 20×20 cm. In principle, the imaging of a very small number of pixels within the reflective element can already be sufficient to obtain the desired additional image information, such as 100×100 μm or 500×500 μm. It will be appreciated that it is also possible to envisage other geometric dimensions or shapes for the reflective surface, for example rectangular shapes can be suitable as well, for example with a large angle α, in order to increase the surface area that is visible to the capturing element. In the illustrated exemplary embodiment, the reflective surface 43 has a size of approximately 2×3 cm.

As shown in the exemplary embodiment, the edge 11 of the object 10 can be detected and imaged by the imaging optical element in the two dimensions which are defined by spatial directions x and z, if this edge 11 lies in the imaging plane 22 of the capturing element 20.

In the drawing of FIG. 2, the object 10 is not yet in the imaging plane 42 which is defined by the reflective element 40. Accordingly, the reflective surface 43 images an area in front of the object 10.

Figure 3:
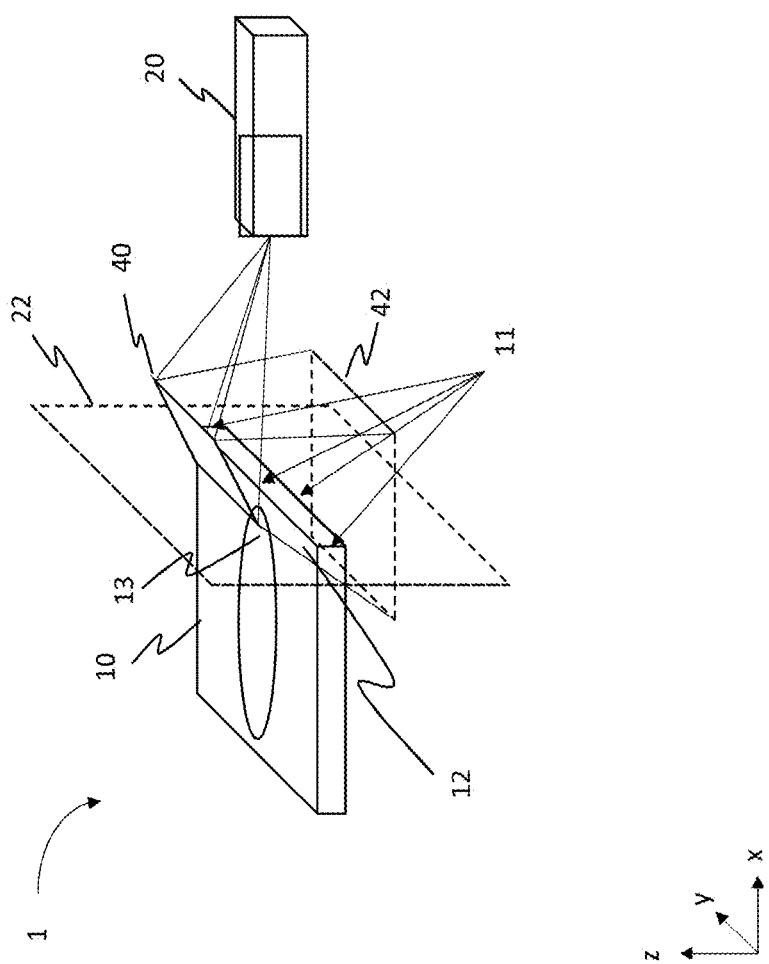
FIG. 3 is a schematic perspective view of the device according to the invention of FIG. 2, where edges of an object are imaged.

FIG. 3 schematically shows the device 1 according to the invention from FIG. 2. However, the reflective element 40 is offset further along the optical axis 21 here, such that a front portion of the object 10 including the edges 11 and a section 12 of the surface area of the object 10 is located in the imaging plane 42 of the reflective element 40. Thus, this area 12 and the object edges 11 can be imaged by the imaging optical element 20 simultaneously with the first view. In this way it is possible, for example, to image an item lying on the surface 12 and at the same time to exactly measure the distance to the front edge 11 of the object, for example. In the illustrated exemplary embodiment, the object 10 is shown as a mask which includes a calibration means 13, merely for illustrative purposes, which calibration means is illustrated schematically and is arranged longitudinally on the mask and now partially lies within the object space of the reflective element 40. It will be appreciated that other objects may also be present instead of the calibration device, for example a pellicle (not shown here).

As shown in the exemplary embodiment, an area 12 of the surface of the object 10 is imaged by the reflective element 40 from a second viewing direction of the object 10, and is copied or mirrored into the object space of the capturing element 20, and this second view of the object 10 is different from the first view. This allows to add a second view or dimension to the first view of the imaging optical element 20 in a particularly simple manner, so that image information can be generated in a virtually three-dimensional manner.

The arrangement of the device 1 thus makes it possible to determine not only the y-z position of the edges 11 but also the x-position of the substrate 10 in the direction of the optical axis 21 of the camera.

Furthermore, it is possible to detect an object such as a calibration means or a pellicle on an upper surface of a mask, and the presence and orientation of the pellicle can be determined. For example, a pellicle may or may not be provided on a mask, it may be located on the upper or lower surface thereof, and it may be oriented longitudinally, parallel to the optical axis, or with a transverse orientation. The device according to the invention can be used to detect a pellicle.

In this case, the reflective element 40 is arranged within the imaging plane 22 of the imaging optical element 20. This makes it possible, during operation or at the time of image capturing, to sufficiently sharply capture both a specific area of the object 10 according to the first view and simultaneously a second area 12 of the object 10 according to the second view.

According to the embodiment shown in FIG. 2, in order to enable views of the object from different directions in the first and second views, the viewing axis corresponding to the first view of the imaging optical element 20, that is the optical axis 21 of the imaging optical element 20, is oriented at an angle $\alpha$ relative to the viewing axis 41 corresponding to the second view as predefined by the reflective element 40. In the embodiment of the invention shown in FIG. 2, these two viewing axes 21 and 41 enclose a right angle, so that the following applies: $\alpha=90°$. This allows for a second view that is orthogonal to the first view, which ultimately enables to image a front view and a plan view of an object 10.

It will be appreciated that other angles $\alpha$ are possible as well. Even a slight inclination between the two viewing axes or views, for example at an angle of $\alpha=5°$ or $\alpha=10°$ can make it possible to generate a second view of the object that differs from the first one and produces additional image information that is of interest for the operation of the device 1.

Larger angles from about $\alpha>70°$ can prove to be favorable in order to enable a plan view or a side view of the object in addition to a front view, for example. As illustrated in the example, an angle of $\alpha=90°$ allows for a second view which is orthogonal to the first view. Even larger angles $\alpha$ make it possible to also image rear areas of the object, for example also undercuts or rear views. Here, front view is understood to mean that side of an object 10 which faces the imaging optical element 20.

In order to generate different further views in a simple manner, it is contemplated according to a refinement of the invention to allow the angle $\alpha$ to be variable, preferably also during operation of the device 1. In other words, the angle $\alpha$ between the two views may differ between one captured image and a subsequently captured image. This can easily be accomplished manually.

However, it is also possible for this purpose, for example, to equip the holder for the reflective element 40 with a small electrically operated servomotor which allows the angle $\alpha$ to be changed accordingly during operation. It will be appreciated that other mechanisms can also be used to change the angle $\alpha$ during operation of the device 1. It goes without saying that this setting or adjustment of the angle $\alpha$ can also be accomplished in a computer-assisted manner, also in combination with computer-assisted image processing, or else manually.

Such an embodiment is highly flexible, since it makes it possible, for example, to capture a plurality of images from different positions in the area surrounding the object, and also different side views of the object, without the need to move the imaging optical element 20 for this purpose. It will be appreciated that it is also possible to combine movements with one another and, for example, to change the angle $\alpha$ when, for example, an end effector approaches a substrate to be picked up, in order to obtain additional information about the object, the support or the environment already during the approach.

In a further embodiment of the invention, at least one marker is provided, which can support the determination of the position or orientation. A marker can also be understood as a predefined reference point or fixed point. Within the meaning of the invention, a marker may include a known part of the device, machine, equipment, or in the system, such as an edge, for example.

Figure 4:
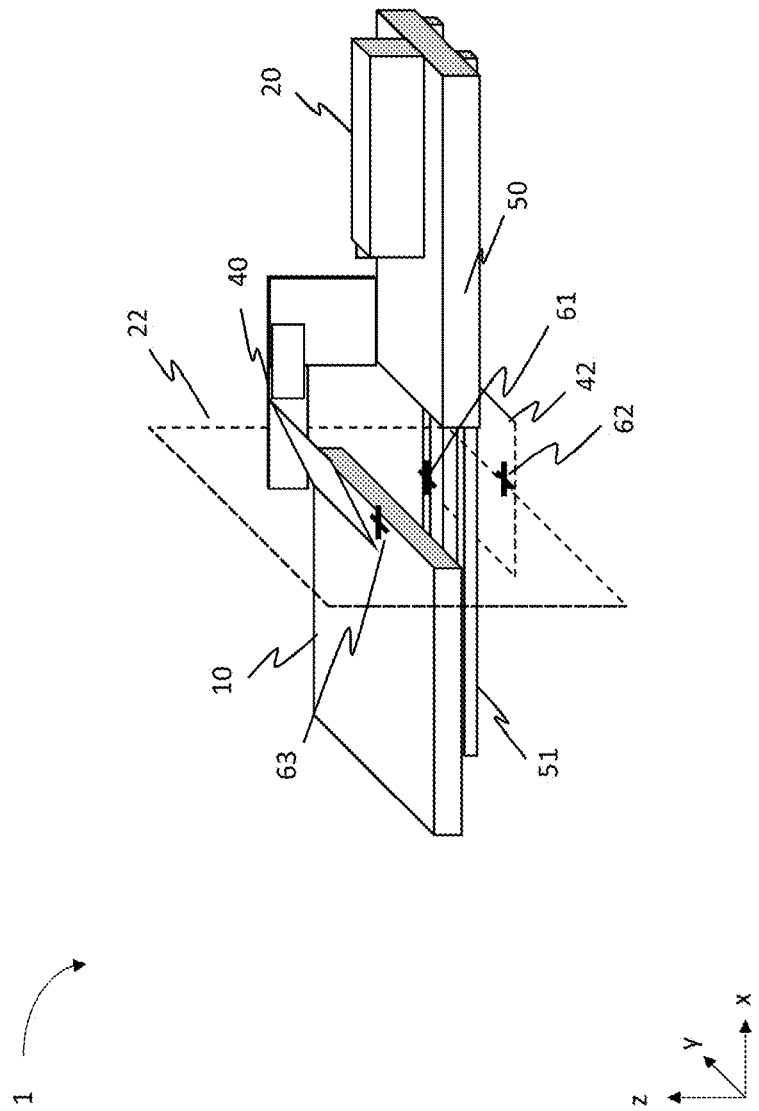
FIG. 4 is a schematic perspective view of the arrangement of a device according to the invention, with markers arranged therein by way of example.

FIG. 4 schematically shows, by way of a further exemplary embodiment, a device 1 according to the invention using the example of an end effector 50 with a pair of forks 51. In this device 1, markers M1 61, M2 62, and M3 63 can be seen, which are arranged at different locations. These markers are merely shown to illustrate the different arrangement options in the illustrated exemplary embodiment, i.e. a single marker M1, M2, or M3 alone can also be sufficient in a device 1 according to the invention.

As illustrated in the exemplary embodiment, markers M1, M2, or M3 may, in principle, be provided at different locations on or at the object 10, on or at the device 1, on stationary or moving objects, parts or components of the device 1, or, for example, also on parts of the end effector 50. These markers M1, M2 or M3 can be used during operation of the device 1 for detecting relative or absolute positions. As shown in the exemplary embodiment, they are therefore arranged so as to be located within the object space of the imaging optical element 20 during operation or during image capturing. It goes without saying that the markers can only be exploited in the course of image analysis if they are also captured in at least one captured image and consequently lie within the object space or the imaging plane.

As shown in the exemplary embodiment, a marker M1 61 is provided directly on the fork 51 of the end effector 50. As a result, the detection of the relative distance, for example visually, and also the manual determination on a display, or solely computer-assisted image processing can be simplified. It is also possible to attach the marker M1 to a different location of the end effector 50 which is not associated with the fork 51. Consequently, this marker M1 will be moved together with the end effector 50.

In addition or as an alternative, a marker M2 62 is provided, which is arranged at a reference position in an imaging plane 22, 42. If this marker M2 62 is attached to a fixed part within the device 1, for example, this allows to determine the absolute position of the end effector 50 in the device 1. When the end effector 50 moves, this marker M2 will accordingly not be moved.

In addition or as an alternative, a marker M3 63 is provided, which is arranged on the object 10. This also allows to determine the relative distance of the end effector 50 relative to the object 10 along the optical axis 21 of the capturing element as soon as the marker M3 is located in the imaging plane. Consequently, this allows to determine the relative x-y position of the end effector relative to the object 10.

The at least one reflective element 40 can be arranged in a permanently fixed or else detachable manner on the device 1, for example on a robot or on an end effector 50 of a robot. For this purpose, an appropriate holder may be provided, which supports the reflective element 40 and is mounted to the device 1, to the robot, or to the end effector 50, for example by screws. In this embodiment, the reflective element 40 will be moved together with the end effector.

However, it may also be fixed permanently or detachably in the area surrounding the device, for example on the machine, the equipment, or in the system. In this case, the reflective element 40 will not be moved when the end effector moves.

It is also possible to provide more than one reflective element 40. In this case, these elements can be arranged at different locations in the system. This allows, for example, to determine the position of the object using the imaging optical element on the end effector.

Figure 5:
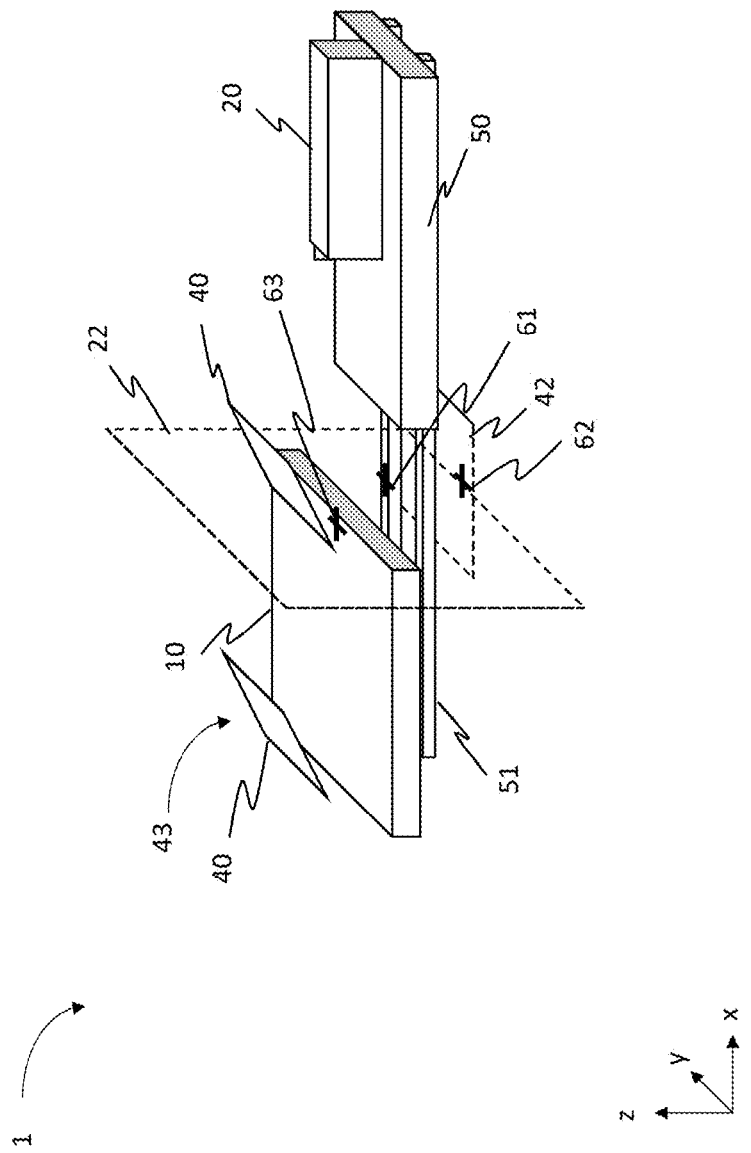
FIG. 5 is a schematic perspective view of a device according to the invention illustrating different possible options of arranging the reflective element.

By way of example, using a further exemplary embodiment, FIG. 5 schematically shows a device 1 according to the invention with two different possible options of arranging the reflective element 40. For example, the figure shows a second position for the reflective element 40 denoted by reference numeral 43. This allows to determine the distance of the object 10 using the imaging optical element 20 which is arranged on the end effector 50 in this exemplary embodiment.

It is also possible to use the marker M3 63 for this purpose, for example if it is located in the x-y plane. Furthermore, a marker M2 62 that is attached at a different point within the system can also be used as a reference marker. Furthermore, a marker M1 61 may also be attached to the fork 51 of the end effector 50 or at another point on the end effector 50.

Figure 6:
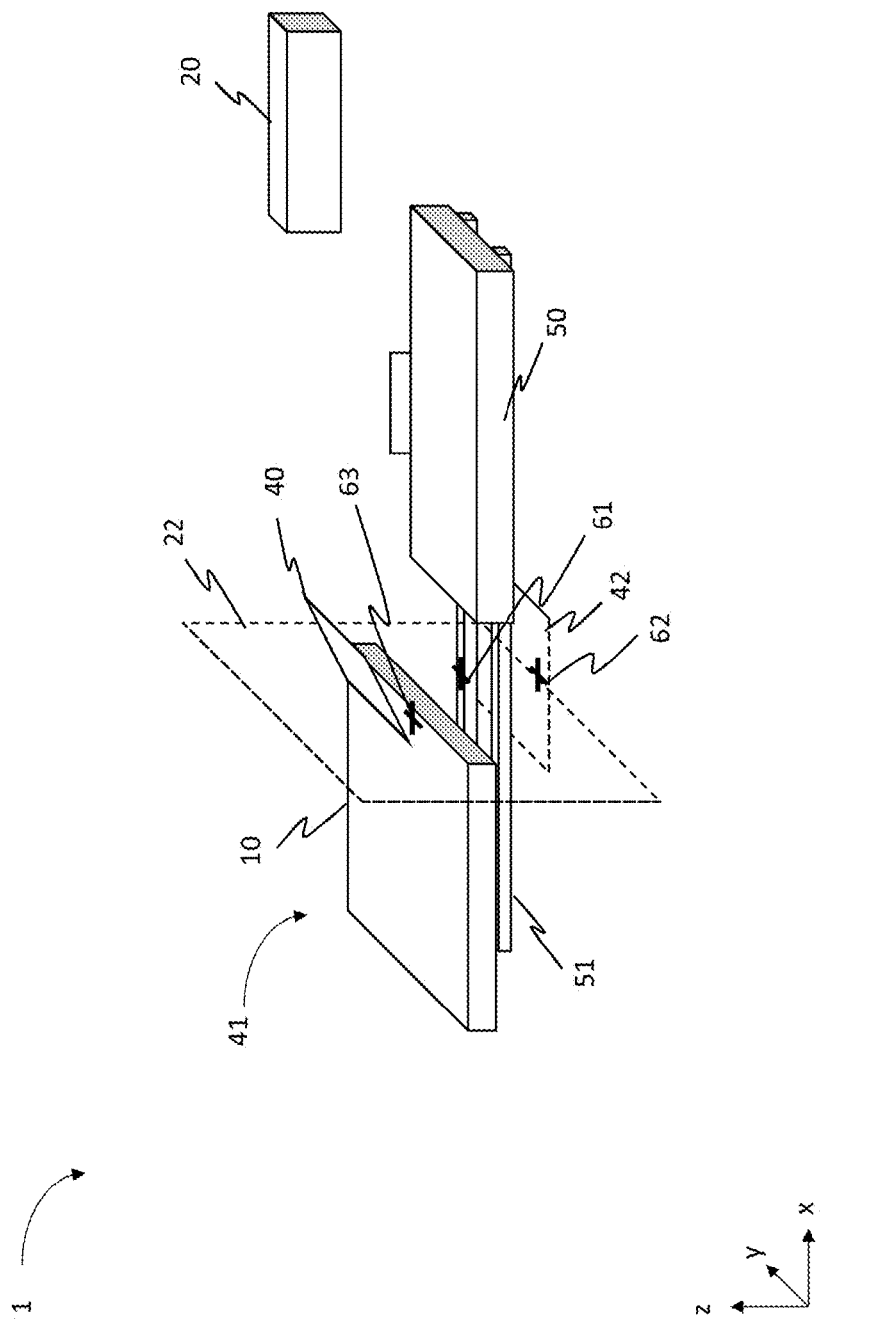
FIG. 6 is a schematic perspective view of a device according to the invention illustrating different possible options of arranging the imaging optical element.

In a further exemplary embodiment, FIG. 6 schematically shows a device 1 according to the invention with a further possible option of arranging the imaging optical element 20.

The at least one imaging optical element 20 can be arranged in a permanently fixed or else detachable manner on the device 1 such as a robot or on a movable end effector 50 of a robot, as shown in FIG. 5. Consequently, in the case of this arrangement, the imaging optical element 20 will be moved along when the end effector or the robot moves, so that the end effector always remains in the object space, for example.

However, as shown in FIG. 6, it is also possible for the at least one imaging optical element 20 to be arranged in a permanently fixed or detachable manner in the area surrounding the device 1, for example on the machine, the equipment, or in the system. In the case of this arrangement, the imaging optical element 20 will not be moved along when the end effector or the robot is moved.

Figure 7:
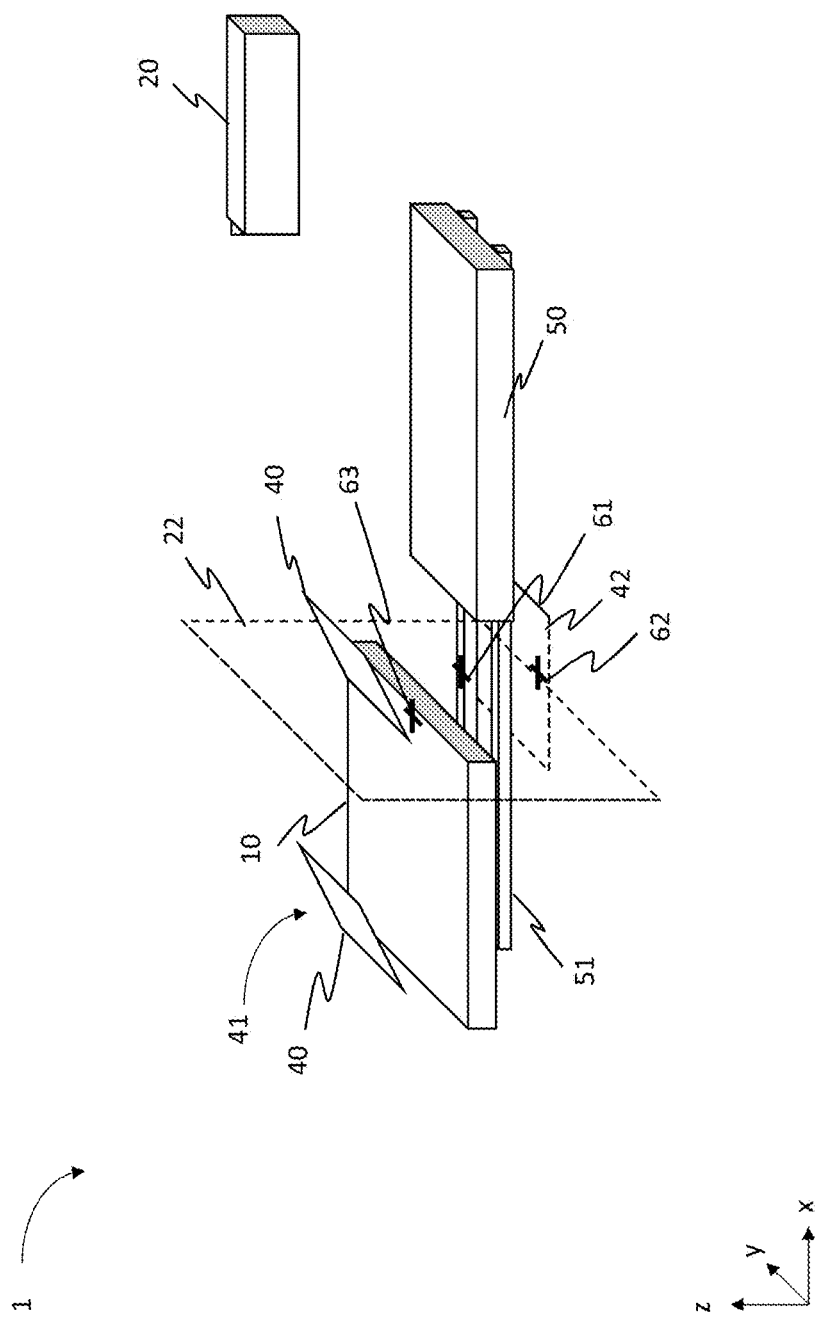
FIG. 7 is a schematic perspective view of different possible options of arranging the reflective element and the imaging optical element.

The various arrangement options may also be combined with one another, as is schematically illustrated by a further exemplary embodiment as shown in FIG. 7. As far as an image captured by the imaging optical element is referred to in the context of the invention, this obviously does not exclude the capturing of a plurality of such images by the device, even in quick succession. For example, it is also possible to record a video using a video camera.

Figure 8:
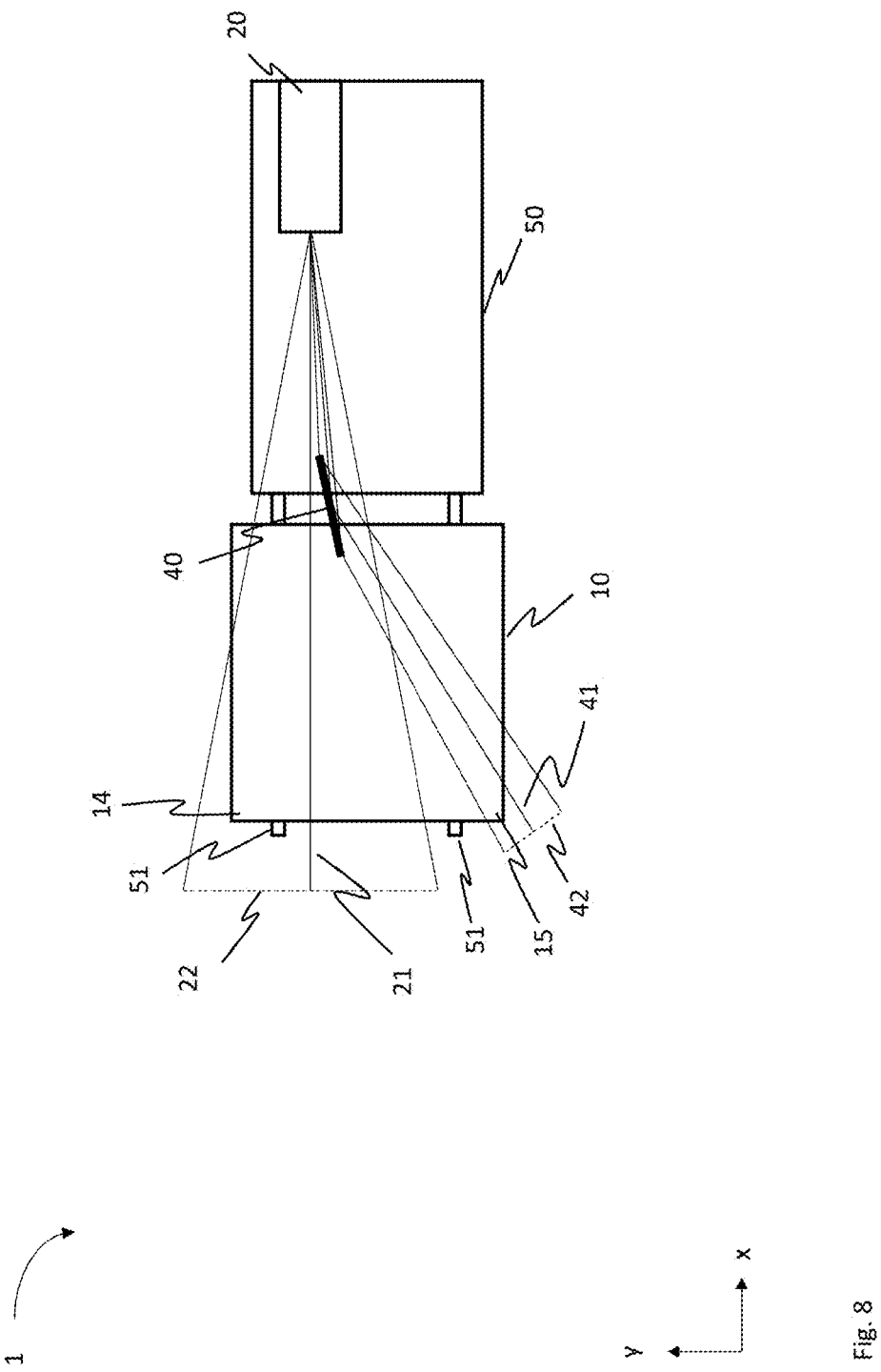
FIG. 8 is a schematic plan view of a further exemplary embodiment of a device according to the invention, in which the object space of the imaging optical element is enlarged.

FIG. 8 shows a further exemplary embodiment of a device 1 according to the invention, with a reflective element 40 that is arranged so as to alter the object space of the imaging optical element 20. In this exemplary embodiment, the object space of the imaging optical element 20 can be enlarged.

The object space is determined, inter alia, by factors such as the optics used, the size of the image capturing sensor, and the distance between the imaging plane and the imaging optical element 20.

Depending on the embodiment, it may happen that without further measures the object space of the imaging optical element 20 does not cover all areas that are to be viewed. In this case it is possible to use further imaging optical elements 20, or alternatively or additionally to move the imaging optical element 20 by a suitable mechanism. Yet another possibility is, for example if the imaging optical element 20 is mounted to an end effector 50, to move it by means of the end effector 50 that is moved by the robot, and to capture images from different views or positions with the imaging optical element 20.

However, according to the invention, it is also possible to use a reflective element 40 for this purpose, in which case, again, a further partial image is generated by the reflective element 40 in the image of the imaging optical element 20, which has a further imaging plane 42 that is outside of or overlapping with the imaging plane 22 of the imaging optical element 20. This allows, in a simple manner, to expand the object space of the imaging optical element 20 by virtue of a partial image, and it is also possible with the partial image to capture areas that do not lie in the imaging plane 22. This principle is illustrated by FIG. 8, which shows a schematic plan view of an arrangement in which the imaging plane 22 of the imaging optical element 20 allows to capture an edge 14 of an object 10, but not an edge 15 of this object 10. However, the reflective element 40 generates a further imaging plane 42 which images the edge 15 in the form of a partial image within the image of the imaging plane 22.

It is of course also possible to use a reflective element 40 of appropriate shape and size to deflect the entire object space of the imaging optical element 20, such that only the second imaging plane 42 will be imaged instead of the first imaging plane 22.

It will be apparent to a person skilled in the art that the features of this embodiment of the invention can also be combined with the embodiments described above.

Figure 9:
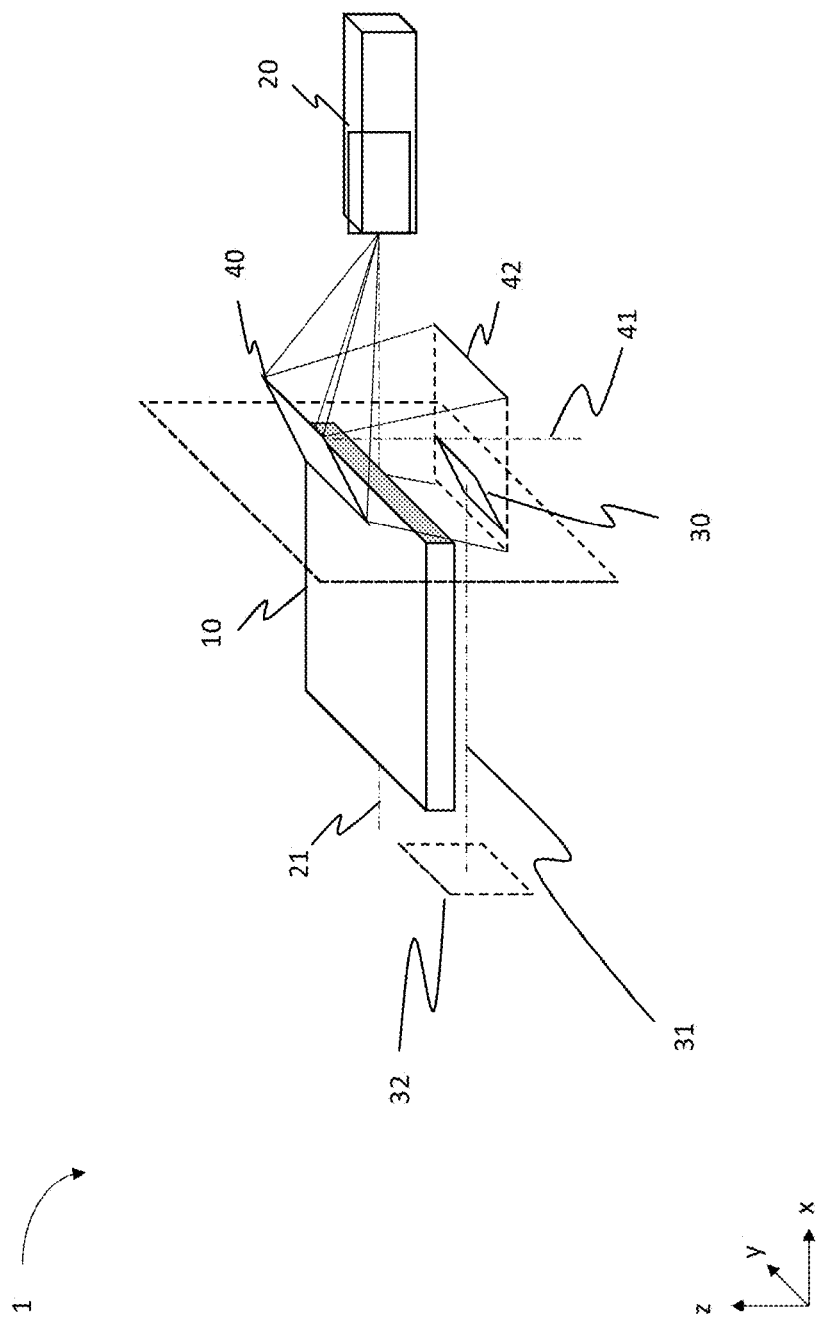
FIG. 9 is a schematic perspective view of a device according to the invention comprising a further reflective element.

FIG. 9 shows a schematic perspective view of a device 1 according to the invention with an additional further reflective element 30.

As can be seen from the arrangement in FIG. 9, it may also be advantageous to change only the position or location of the additional optical axis or further view, irrespective of its orientation relative to the optical axis of the imaging optical element. This allows, for example, to image areas of an object 10 into the imaging plane 22 of the imaging optical element, which are otherwise not visible.

The embodiment of FIG. 9 shows, merely by way of example, how an additional object space with a second imaging plane 42 can be imaged using a first reflective element 40, in the example a first mirror, and yet another object space with yet another imaging plane 32 can be imaged using a second reflective element 30, in the example a second mirror. The embodiment of FIG. 9 shows, merely by way of example, an additional object space with a second imaging plane 42 by virtue of a first reflective element 40, in the example a first mirror, and a second reflective element 30, in the example a second mirror, allows to image yet another object space with an even further imaging plane 32. In this case, the imaging planes 42 and 32 are combined in the imaging plane 22 of the imaging optical element 20.

In the illustrated arrangement, this provides the possibility of even viewing areas which lie below the object 10 and might therefore possibly be obstructed by the object 10, in the viewing direction of the optical axis 31 generated by the second mirror.

In the illustrated embodiment, the relevant optical axes 21, 31, and 41 are parallel or orthogonal to each other. However, it will be appreciated that all or some of the optical axes 21, 31, and 41 may enclose different angles to one another.

The at least one reflective element 40 in the object space of the imaging optical element 20 hides part of the object space, which is deflected by the reflective element 40. FIG. 10 schematically shows a perspective view of the device according to the invention from FIG. 2, in which this hidden area is indicated by the area denoted with reference numeral 23.

As a result, the areas in the object space directly behind this obstructed area 23 will not be visible to the imaging optical element 20. It may therefore be advantageous to use reflective elements 40 which are partially transmissive to light, for example semi-transparent mirrors, such that these obstructed areas 23 can then also be made visible.

The different imaging planes 22, 32, and 42 may be at a different distance from the imaging optical element 20. This relationship is illustrated in FIG. 11 which again shows a schematic perspective view of the device according to the invention from FIG. 2. In addition, the different distances are illustrated in this drawing by the exemplary dashed and dash-dotted lines denoted by reference numerals 24 and 25.

For a given viewing distance or depth of field of the imaging optical element 20, this may cause the different imaging planes to at least not all being imaged equally sharply. For example, viewing distance 24 in the drawing is smaller than viewing distance 25 generated by the reflective element 40.

It may therefore happen, for example, that the image captured by the imaging optical element 20 is sharp at a viewing distance 24, but not sharp anymore at a viewing distance 25. According to the invention, this can be compensated for by supplementing the reflective element 40 with optical means such as optical lenses, optics, or objective lenses, which are suitable for restoring the sharpness of the image in the imaging plane of the imaging optical element 20.

Figure 12:
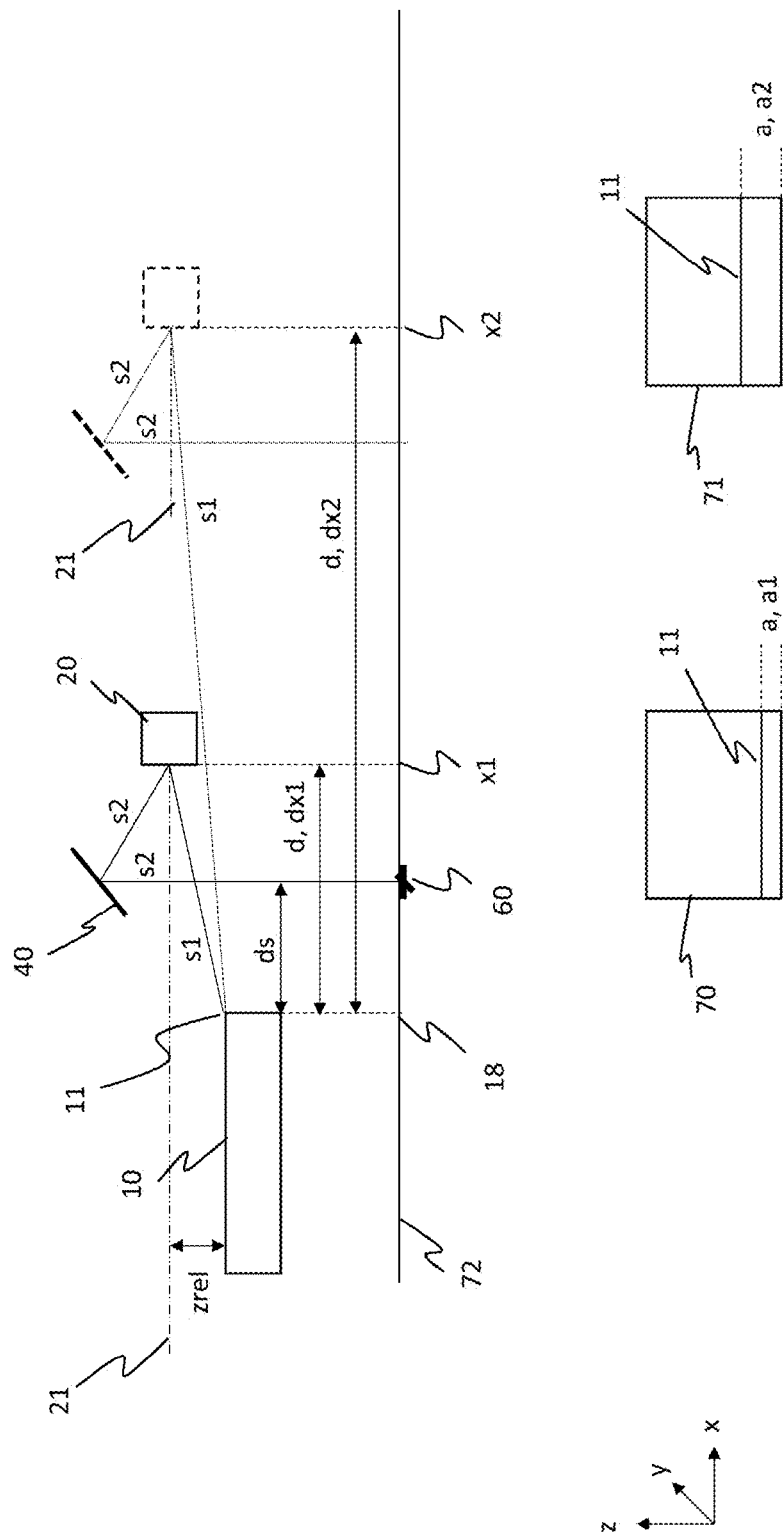
FIG. 12 is a schematic side view of an exemplary embodiment of a device according to the invention for illustrating the determination of a position.

The second visual axis 41 or further imaging plane 42 generated by the reflective element 40 also allows to produce spatial references which enable determination of a spatial position or determination of a spatial relative position. FIG. 12 shows a schematic side view of an exemplary embodiment to illustrate the determination of a position.

For example, in the exemplary embodiment, the distance in spatial direction z, zrel, is to be determined between an edge 11 and an imaging optical element 20, by imaging the edge 11 of the object 10 in the image and evaluating the height a of the edge 11 in the image in order to determine the distance zrel.

However, when the imaging optical element 20 assumes different positions, for example as indicated by reference symbols x1 and x2 in the drawing, the edge 11 will be imaged at different points a1 and a2 due to the beam path s1, since the distance d is different in each case, as indicated in the drawing by reference symbols dx1 and dx2. This makes it impossible to determine the distance zrel without additional information, for example on the basis of the distance d. In the drawing, reference numeral 70 shows the image with the imaging optical element 20 at the position x1, and reference numeral 71 shows the image with the imaging optical element 20 at the position x2. Reference numeral 18 shows the fixed position of the object in spatial direction x on a reference plane in spatial direction z, which is denoted by reference numeral 72.

Therefore, a marker 60 is used in a preferred embodiment of the invention, which marker lies in the imaging plane 42 of the reflective element 40.

Furthermore, the imaging optical element 20 can be moved in the spatial direction x in which the marker 60 lies in imaging plane 42. The distance ds of this marker 60 from the object 10 is known, so that the distance d of the imaging optical element 20 from the edge 11 can be determined. This makes it possible to determine the relative distance zrel.

The edge 11 of the object 10 is imaged by virtue of the beam path s1 in each case and can be seen in the images 70, 71 at a specific height "a" which, however, depends on the position of the imaging optical element 20 in spatial direction x.

For certain application cases it may be necessary to illuminate the object 10 which is to be imaged in an image, or the area surrounding the object 10. For this purpose, light sources can be used, which are installed in the vicinity of the imaging optical element 20 or at a certain distance therefrom. Such light sources often already comprise a reflector which is able to direct the beam path of the light source or part thereof in a specific direction.

For particular application cases it may be useful to illuminate the object to be imaged from at least one direction that is not the direction of the light source's beam path. According to the invention, the reflective element 40 can also be used for this purpose, as illustrated in FIG. 13 by way of an exemplary embodiment of the invention.

Figure 13:
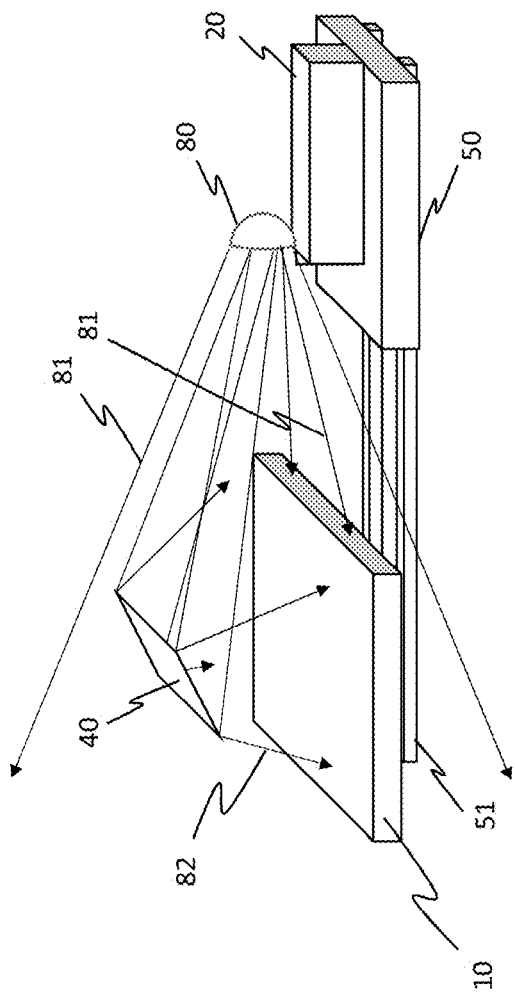
FIG. 13 is a schematic perspective view of a device according to the invention comprising an illumination device, with the reflective element being used to deflect light beams.

FIG. 13 shows a schematic perspective view of a device 1 according to the invention comprising a light source 80, in which the reflective element 40 is used to deflect light rays. Reference numeral 81 indicates light rays which are not deflected by the reflective element 40, merely for illustrative purposes. Reference numeral 82 indicates light rays which are deflected by the reflective element 40 so that they are incident on the object 10 from a second direction which is different from the main direction of the light radiation of light source 80. The reflective element 40 is therefore at least partially arranged in the beam path of light source 80.

It will be appreciated that, according to the invention, the aforementioned embodiments relating to the arrangement of the reflective element 40 and/or of the imaging optical element 20 can be combined with the embodiment discussed here. The reflective element 40 may be mounted so as to be stationary in the system, or may be movable, for example on the arm of a robot or on an end effector 50. It is also contemplated for the reflective element 40 to be configured so as to be movable such that, for example, it is possible to illuminate different areas or sides of the object by tilting the reflective element 40 relative to the direction from which the light of the light source 80 comes.

According to yet another embodiment of the invention it is contemplated to also provide the reflective element 40 with additional optical properties for deflecting the direction of illumination, such as curvatures or optics that are capable of changing the beam path of the illumination, for example to further widen or else focus the beam path, or in order to generate more than one deflection direction of the beam path of the light source 80 using a reflective element 40.

Figure 14:
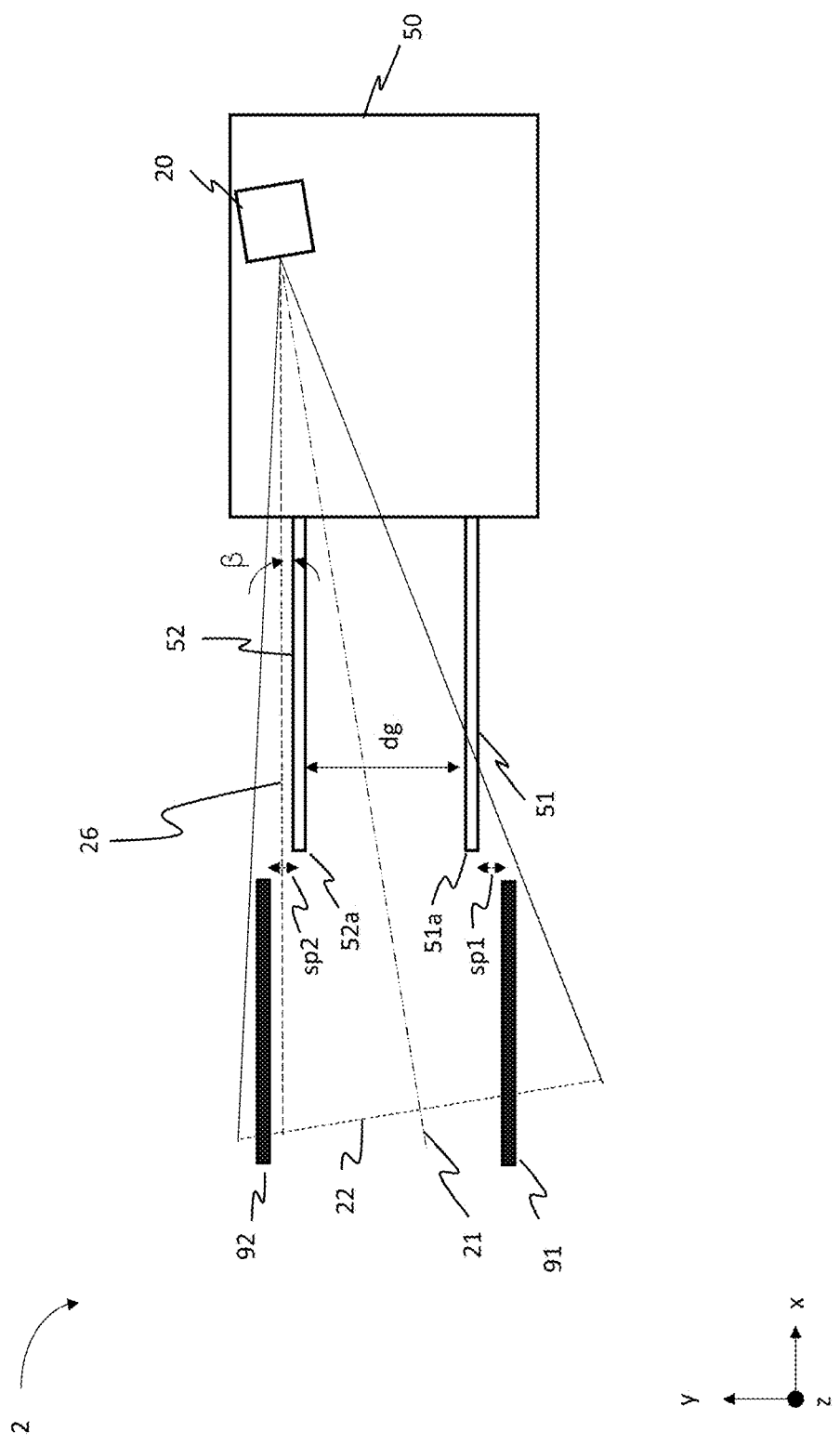
FIG. 14 is a schematic plan view of a further device according to the invention.
Figure 15:
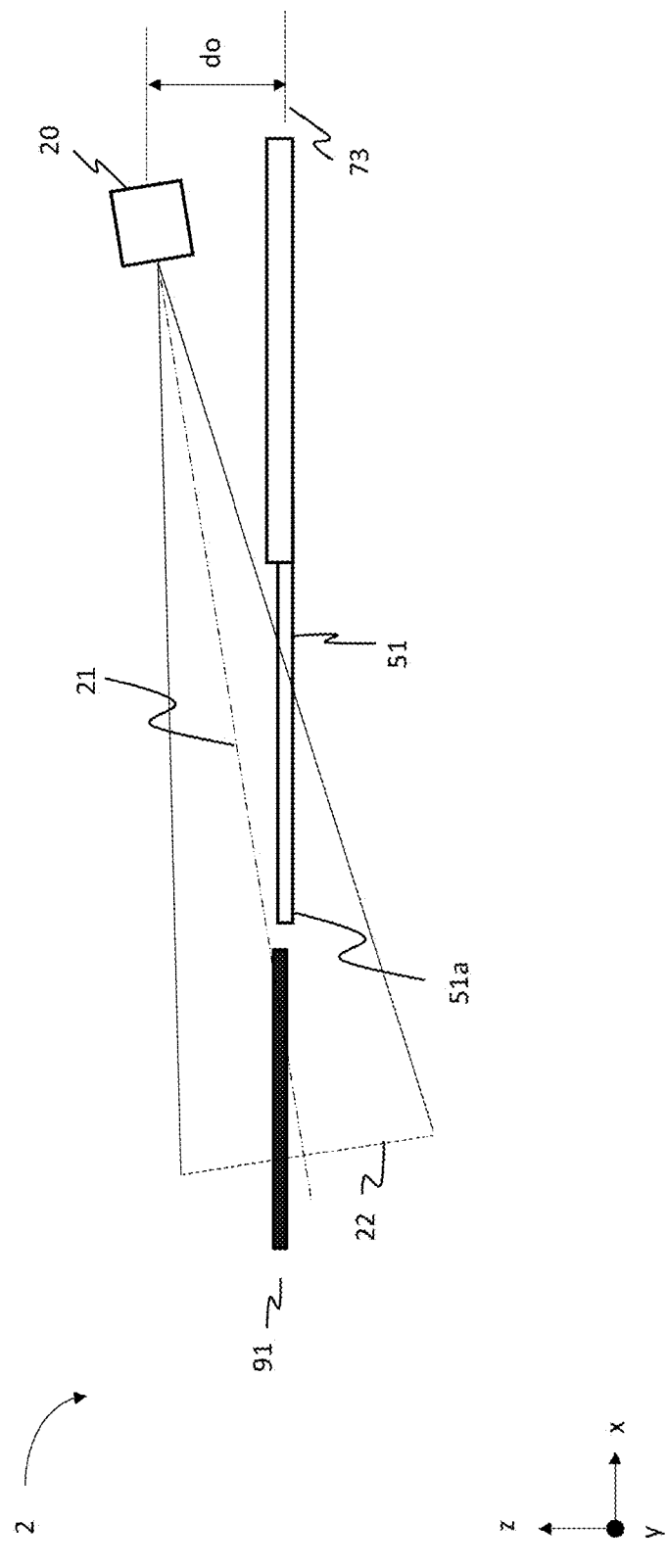
FIG. 15 is a schematic side view of the further device according to the invention from FIG. 14.
Figure 16:
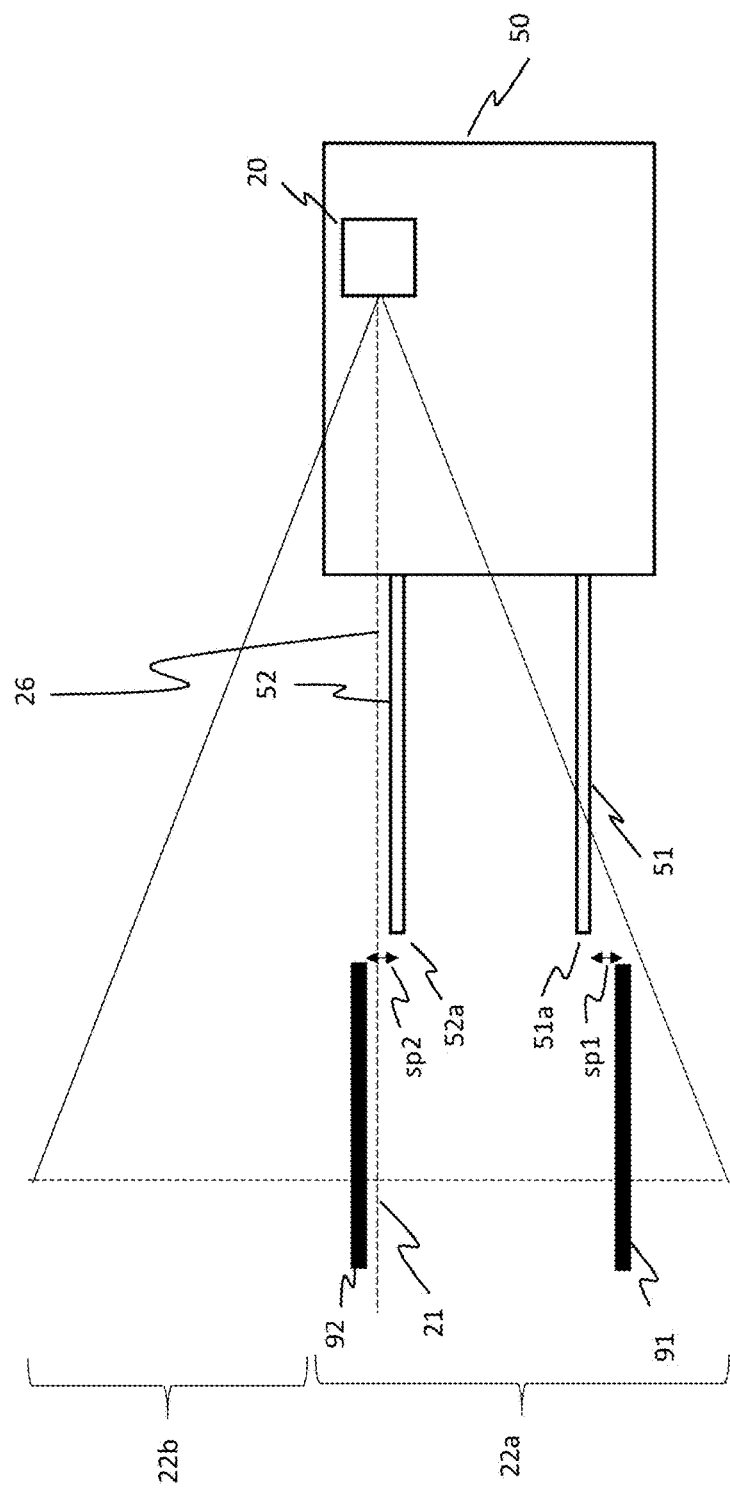
FIG. 16 is a schematic plan view of the further device according to the invention from FIG. 14, with a modified arrangement of the imaging optical element.

Yet another embodiment of the invention is shown in FIGS. 14 to 16.

FIG. 14 is a schematic plan view of a device 2 according to the invention, which is illustrated without a reflective element 40. In this example, the device 2 is part of a machine of the semiconductor industry, comprising a robot that has a movable end effector 50 and forks 51 arranged thereon. A reflective element 40 as discussed above can of course also be employed in these embodiments.

The underlying basic principle of this embodiment of the invention is based on a combination of:
(a) an angular orientation of the optical axis 21 of the imaging optical element relative to the spatial rotational axis z;
(b) an angular orientation of the imaging optical element relative to the spatial rotational axis y;
(c) an offset of the optical axis 21 of the imaging optical element to a plane spanned by spatial directions x and y of the object 10 and/or the forks 51 and/or the end effector 50.

In this way it is possible, as shown in the exemplary embodiment of FIG. 14, to image and analyze, for example, a gap between a substrate, forks and/or an end effector using only a single imaging optical element 20, so that the relative position of the forks can be determined in all degrees of freedom x, y, z, as well as angles of the forks of the end effector relative to one another.

Just by way of example, FIG. 14 shows two supports 91, 92, for example for an object 10 such as a substrate in the system, e.g. a support in a processing station, or a support at another location in the system, or a support in a cassette or a container.

The spacing between the forks 51, 52 of the end effector 50 is indicated by dg, and the ends of the forks 51, 52 of the end effector 50 are denoted by reference numerals 51a and 52a. They are spaced apart from one another in spatial direction y.

In the illustrated arrangement, this spacing or distance dg can be determined from the image captured by the imaging optical element 20 if the geometric relationship in terms of the location and position of the imaging optical element 20 relative to the end effector 50 and/or to the forks 51, 52 and/or the ends 51a, 52a thereof is known.

These gaps, i.e. intermediate or free spaces between the support 91, 92 and the fork 51, 52, are denoted by reference symbols sp1 and sp2. Along the dashed line denoted by reference numeral 26, which merely by way of example represents a light ray that can be imaged by the imaging optical element 20 in a plane spanned by spatial directions x and y, the imaging optical element 20 will see the gap sp2 in the x-y plane to be approximately parallel to the fork 52 of the end effector 50 and/or to the support 92. This allows to monitor and check the gap sp2 with very high accuracy when the end effector 50 approaches the support 92, in order to avoid a collision. For illustrative purposes, an angle β is indicated in FIG. 14 between light ray 26 and an edge of the gripper 52. In the present example, this angle β is approximately 0.5°. More generally, it is favorable for the angle β between the at least one light ray 26 and the fork 52 and/or the support 92 to amount to not more than +/−10°, preferably not more than +/−5°, and most preferably not more than +/−2°.

The invention can therefore also encompass a device for imaging an object, preferably imaging in at least two different views simultaneously, which comprises at least one imaging optical element, wherein at least one light ray that can be imaged using the imaging optical element runs parallel or approximately parallel to at least one fork and/or to at least one support in a plane spanned by spatial directions x and y, and wherein an angle β between this at least one light ray and the fork and/or the support is at most +/−10°, preferably at most +/−5°, and most preferably at most +/−2°.

The imaging optical element 20 is therefore angled relative to the z-axis and/or relative to the y-axis such that the line 26 between the support 92 and the fork 52 is visible. In this case, the imaging optical element 20 is preferably firmly connected to the end effector 50, as in the illustrated example.

In this way, the dimensions sp1, sp2 of the gap can be determined on the basis of known dimensions of the supports 91, 92. This is particularly useful if, for example, the exact alignment of an end effector 50 or of forks 51, 52 has to be considered at any point in time of the movement of the end effector when picking up a substrate from a support in order to prevent any damage. Since the supports may also similarly be located in the object space of the imaging optical element 20, the position of the supports 91, 92 can be determined relative to one another and relative to the pick-up element and/or to the end effector 50.

FIG. 15 is a schematic side view of the further device 2 according to the invention from FIG. 14. Reference numeral 73 denotes a plane of the end effector and/or of the object 10 (not shown in the example) and/or of the forks. Reference symbol "do" indicates the offset to the plane 73 in spatial direction z.

The imaging optical element 20 is oriented at an angle relative to the spatial rotational axis y and/or to the spatial rotational axis z. In the exemplary embodiment, the imaging optical element 20 is connected to the end effector 50 and is arranged with an offset in spatial direction z relative to the plane 73.

Alternatively, the imaging optical element 20 may also be oriented such that the gap sp1, the forks 51, 52, and the supports 91, 92 are imaged without an angular rotation about the z-axis, by having the optical axis thereof aligned at least approximately in line with the gap. However, a drawback of such an arrangement is that the field of view of the camera has to be larger in this case, and as a result thereof a region of the field of view will be generated, that is not required or not necessarily required.

To illustrate this, FIG. 16 shows a schematic plan view of the further device according to the invention from FIG. 14, in which the arrangement of the imaging optical element has been modified. Here, reference numeral 22a designates the area in the imaging plane of the imaging optical element 20, which is required, and reference numeral 22b designates the area in the imaging plane, which is not required.

In order to achieve the same resolution of the imaging plane or of the image field and hence the same accuracy in determining positions or distances as with the angular orientation, a significantly higher pixel resolution of the camera is required.

It is assumed here, that imaging optical elements 20 operating in the two-dimensional domain can provide the required high performance, for example high resolution, such as 1920×1080 pixels, or 1280×720 pixels, for example, such as in device 1, as well as short image capturing times or high frame rates, such as 60 fps, and that the device can cope with only one imaging optical element.

Other currently available image capturing technologies which also enable three-dimensional image capturing, for example stereo cameras, light field cameras or TOF cameras, which measure the transit time, or time of flight, of the light for each pixel until it is incident on the image sensor and calculate information about the distance of the pixel on the object on the basis of this transit time, are currently inferior to the imaging optical elements operating in the two-dimensional domain, at least in one of the aforementioned aspects.

Irrespective of this, further developments in these image capturing technologies can make it favorable to also obtain three-dimensional image information and to use such image capturing technologies for the device. At the present time, however, the disadvantages are predominant, for example low resolution as in TOF cameras, dimensions, and costs of using two cameras instead of a single camera in the case of stereo cameras.

Irrespective of this it is possible and also intended to employ and use imaging optical elements 20 corresponding to these image capturing technologies for the device 1, 2 according to the invention, in particular if the aforementioned drawbacks can be overcome by further technological developments.

FIGS. 17 and 18 show one possible exemplary embodiment which uses such an imaging optical element 120 with an optical axis 121, which operates in the three-dimensional domain. These exemplary embodiments illustrate the detection of the position of a pellicle 111 on a mask 110, in which the device 3 comprises an optical element 120 operating in the three-dimensional domain and having an optical axis 121. In FIG. 17, the pellicle 111 lies on top of the mask 110 and is aligned along the extension of the optical axis 121 of the imaging optical element 120. In FIG. 18, the pellicle 111 lies on top being aligned transversely to the extension of the optical axis 121 of the imaging optical element 120.

In the associated images 171, 172 captured by the element 120, the distance of the objects 91, 92, 110, and 111 from the element 120 in spatial direction x are apparent based on the different shades of gray in the example. A scale is also given in the example, from which the distance can be determined.

In this example it is possible to identify the y-z position of objects such as the pellicle 111, mask 110, and supports 91, 92 in the image 171, 172 captured by the element 120, as well as their distance x to the imaging optical element 120 based on the gray levels, which are given in the form of a scale by way of example.

In the exemplary embodiment, the imaging optical element 120 is mounted on the end effector 50 and allows to determine:
- whether a pellicle 111 is placed on top of the mask 110 in longitudinal (FIG. 17) or transverse (FIG. 18) orientation;
- at which y-z position with respect to the end effector 50 the mask 110, supports 91, 92, and pellicle 111 are located;
- at which x-position with respect to the end effector 50 the mask 110, supports 91, 92, and pellicle 111 are located.

By using imaging optical elements operating in the three-dimensional domain it is thus possible to obtain additional image information which can advantageously be used for the analysis.

The invention claimed is:

1. A device for simultaneously imaging an object in at least two different views, comprising
at least one imaging optical element; and
at least one reflective element;
wherein the reflective element is at least partly arranged within an object space of the imaging optical element, wherein an optical axis of the imaging optical element is associated with a first view of the object; and
wherein the reflective element is operable to image a second view of the object, which is different from the first view.

2. The device according to claim 1, wherein during operation, when using the device or during adjustment, the second view allows to at least partly image areas of the object which are not located in the object space of the imaging optical element.

3. The device according to claim 1, wherein the reflective element is located within an imaging plane of the imaging optical element and comprises at least one reflective surface for imaging the second view of the object, which surface is preferably planar.

4. The device according to claim 1, wherein at least the first view and the second view of the object can be captured simultaneously in one image by the imaging optical element during operation and/or during image capturing.

5. The device according to claim 1, wherein the imaging optical element and the reflective element are arranged relative to one another such that the optical axis of the imaging optical element and a viewing axis associated with the second view as defined by the reflective element enclose an angle $\alpha$, wherein $\alpha > 0°$; and/or wherein these axes are laterally offset from one another.

6. The device according to claim 1, wherein at least one marker is provided, which can also be imaged by the imaging optical element during image capturing, and which is arranged on or at the device, on or at an object or substrate, on or at a robot, on or at an end effector, or on a machine, equipment or system.

7. The device according to claim 1, wherein at least one further reflective element is provided, which is operable to image at least a third view of the object, wherein the third view is different from the first and second views, and wherein the at least a third view allows to at least partly image areas of the object that are not, or not completely, located in the object space of the imaging optical element or in the second view.

8. The device according to claim 1, wherein the at least one imaging optical element is arranged, in a permanently fixed or detachable manner, on or at the device, on or at a robot, on or at an end effector, or on a machine, equipment or system.

9. The device according to claim 1, wherein the at least one reflective element is arranged, in a permanently fixed or detachable manner, on or at the device, on or at a robot, on or at an end effector, or on machine, equipment or system.

10. The device according to claim 1, wherein the imaging optical element generates a two-dimensional image of the object.

11. The device according to claim 1, wherein the imaging optical element comprises a camera, a 2D camera, a video camera, or an image sensor.

12. The device according to claim 1, wherein a captured image of the object is used for visual, manual or automatic analysis.

13. The device according to claim 1, further comprising a display element for visualizing a captured image for a user, and/or computer-assisted image processing for further analysis of the captured image.

14. The device according to claim 1, wherein the reflective element comprises an optical means that is capable of reflecting and/or deflecting electromagnetic radiation, in a visible wavelength range, comprising a mirror or a prism or some other reflective surface.

15. The device according to claim 1, wherein the reflective element is semi-transparent at least in sections thereof, in a visible wavelength range.

16. The device according to claim 1, wherein the reflective element comprises at least one further optical means for selecting incident electromagnetic radiation, in particular a filter, a polarization filter, an infrared blocking filter, a UV blocking filter, or a color filter.

17. The device according to claim 1, wherein the reflective element comprises at least one further optical means for influencing sharpness, including a lens, optics, or an objective lens.

18. The device according to claim 1, further comprising an illumination device which is adapted to illuminate the object from a first direction.

19. The device according to claim 18, wherein at least one reflective element is at least partly arranged in a beam path of the illumination device and is aligned such that at least part of light from the illumination device is deflected and directed onto the object from at least one second direction.

20. The device for imaging an object in at least two different views according to claim 1, comprising at least one imaging optical element, wherein at least one light ray can be imaged using the imaging optical element running parallel or approximately parallel to at least one fork and/or to at least one support in a plane spanned by spatial directions x and y; and wherein an angle β between this at least one light ray and the fork and/or the support is not more than +/−10°.

21. A method for simultaneously imaging an object in at least two different views, comprising a device according to claim 1.

22. A machine, equipment or system, for use in the semiconductor industry, comprising a device according to claim 1.

23. The machine, equipment or system according to claim 22, wherein images captured by the device can be used for teach-in, for adjustment, for controlling and/or for monitoring the semiconductor industry equipment, system or machine, and/or for controlling, adjusting, teaching-in, monitoring a robot.

24. A method for simultaneously imaging an object in at least in at least two different views according to claim 1, wherein the optical axis of the imaging optical element defines a viewing direction of the imaging optical element perpendicular to an imaging plane, and wherein a viewing axis associated with the second view as defined by the reflective element is separate from the optical axis.

25. A method for simultaneously imaging an object in at least in at least two different views according to claim 24, wherein the at least one imaging optical element creates an imaging plane, whereas the reflective element creates another object space with another, different imaging plane within the object space of the at least one imaging optical element.

26. A method for simultaneously imaging an object in at least in at least two different views according to claim 1, wherein the at least one imaging optical element includes a single two-dimensional imaging optical element.

27. A method for simultaneously imaging an object in at least in at least two different views according to claim 1, wherein the at least one imaging optical element is oriented perpendicular to the imaging axis, whereas the at least one reflective element is oriented perpendicular to a viewing axis associated with the second view but not along the imaging axis such that the imaging and viewing axes are not coaxial.

* * * * *